US009215797B2

(12) United States Patent
Mori et al.

(10) Patent No.: US 9,215,797 B2
(45) Date of Patent: Dec. 15, 2015

(54) TRANSFER SHEET PROVIDED WITH TRANSPARENT CONDUCTIVE FILM MAINLY COMPOSED OF GRAPHENE, METHOD FOR MANUFACTURING SAME, AND TRANSPARENT CONDUCTOR

(75) Inventors: Fujio Mori, Kyoto (JP); Hajime Terazono, Kyoto (JP)

(73) Assignee: NISSHA PRINTING CO., LTD., Kyoto (JP)

( * ) Notice: Subject to any disclaimer, the term of this patent is extended or adjusted under 35 U.S.C. 154(b) by 145 days.

(21) Appl. No.: 14/009,809

(22) PCT Filed: Apr. 6, 2012

(86) PCT No.: PCT/JP2012/059523
§ 371 (c)(1),
(2), (4) Date: Oct. 4, 2013

(87) PCT Pub. No.: WO2012/137923
PCT Pub. Date: Oct. 11, 2012

(65) Prior Publication Data
US 2014/0014400 A1   Jan. 16, 2014

(30) Foreign Application Priority Data

Apr. 7, 2011 (JP) .................................. 2011-085562
Apr. 7, 2011 (JP) .................................. 2011-085563
Apr. 11, 2011 (JP) .................................. 2011-087604

(51) Int. Cl.
*H05K 1/02* (2006.01)
*B29C 45/14* (2006.01)
(Continued)

(52) U.S. Cl.
CPC .......... *H05K 1/0274* (2013.01); *B29C 45/1418* (2013.01); *B29C 45/14639* (2013.01);
(Continued)

(58) Field of Classification Search
CPC ..... G06F 3/044; G06F 3/045; B29C 45/1418; B29C 45/14639; B29C 45/14; B29C 45/16; B32B 15/08; B32B 27/08; B32B 27/281; B32B 27/306; B32B 7/06; B32B 7/12; B32B 33/00; B32B 9/00; H05K 1/09; H05K 1/0274
USPC ............ 156/247, 242, 233; 174/258; 428/408
See application file for complete search history.

(56) References Cited

U.S. PATENT DOCUMENTS 6,527,898 B1    3/2003  Nakamura
8,018,563 B2 *  9/2011  Jones et al. .................. 349/139
(Continued)

FOREIGN PATENT DOCUMENTS

CN      1328508      12/2001
CN      1703326      11/2005
(Continued)

OTHER PUBLICATIONS

English translation of International Preliminary Report on Patentability dated Oct. 8, 2013 along with the Written Opinion.
(Continued)

*Primary Examiner* — Timothy Thompson
*Assistant Examiner* — Guillermo Egoavil
(74) *Attorney, Agent, or Firm* — Wenderoth, Lind & Ponack, L.L.P.

(57) ABSTRACT

As Technical Problem, provided is a transfer sheet using graphene as a transparent conductive material, and a transparent conductor. As solution problem, there is provided a transfer sheet that includes a substrate sheet having releasability and smoothness, a metal thin film layer partially or entirely formed on the surface of the substrate sheet to reflect the smoothness of the substrate sheet, and a transparent conductive film layer formed on the metal thin film layer and mainly composed of graphene.

12 Claims, 18 Drawing Sheets

(51) Int. Cl.
  *G06F 3/044* (2006.01)
  *G06F 3/045* (2006.01)
  *B32B 7/06* (2006.01)
  *B32B 7/12* (2006.01)
  *B32B 27/08* (2006.01)
  *B32B 27/28* (2006.01)
  *B32B 27/30* (2006.01)

(52) U.S. Cl.
  CPC ... *B32B 7/06* (2013.01); *B32B 7/12* (2013.01); *B32B 27/08* (2013.01); *B32B 27/281* (2013.01); *B32B 27/306* (2013.01); *G06F 3/044* (2013.01); *G06F 3/045* (2013.01); *B32B 2255/10* (2013.01); *B32B 2255/205* (2013.01); *B32B 2307/202* (2013.01); *B32B 2307/412* (2013.01); *B32B 2307/538* (2013.01); *B32B 2307/748* (2013.01); *B32B 2457/00* (2013.01)

(56) References Cited

U.S. PATENT DOCUMENTS

| | | |
|---|---|---|
| 2006/0068135 A1 | 3/2006 | Shigemura |
| 2009/0032777 A1 | 2/2009 | Kitano et al. |
| 2009/0110627 A1 | 4/2009 | Choi et al. |
| 2011/0030772 A1 | 2/2011 | Veerasamy |
| 2011/0244210 A1 | 10/2011 | Choi et al. |
| 2012/0040145 A1* | 2/2012 | Zenasni .............. B81C 1/00126 428/189 |
| 2012/0103660 A1* | 5/2012 | Gupta ................. H01L 51/0021 174/126.2 |

FOREIGN PATENT DOCUMENTS

| | | |
|---|---|---|
| CN | 101423209 | 5/2009 |
| JP | 09262867 A * | 10/1997 |
| JP | 09262867 A * | 10/1997 |
| JP | 2000340908 | 12/2000 |
| JP | 2011-32156 | 2/2011 |
| JP | 2011-105569 | 6/2011 |
| JP | 2012-87010 | 5/2012 |
| WO | 2006/132254 | 12/2006 |
| WO | 2011/016832 | 2/2011 |
| WO | 2012/056632 | 5/2012 |

OTHER PUBLICATIONS

K. S. Novoselov et al., "Electric Field Effect in Atomically Thin Carbon Films", Science, vol. 306, pp. 666-669, Oct. 22, 2004.

S. Bae et al., "Roll-to-Roll Production of 30-inch Graphene Films for Transparent Electrodes", Nature Nanotechnology, vol. 5, pp. 574-578, Aug. 2010.

International Search Report issued Jul. 3, 2012 in International (PCT) Application No. PCT/JP2012/059523.

* cited by examiner

Fig. 5
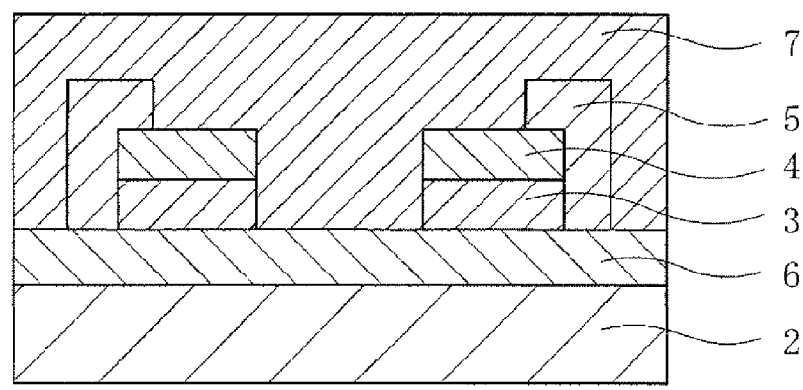
Fig. 6
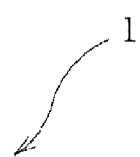
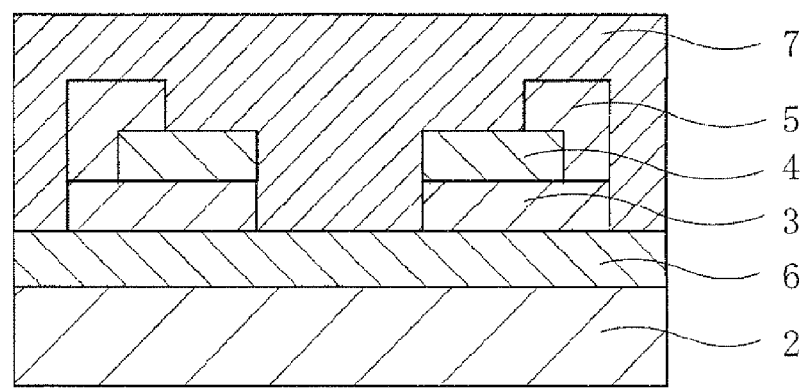

Fig. 12
(a)
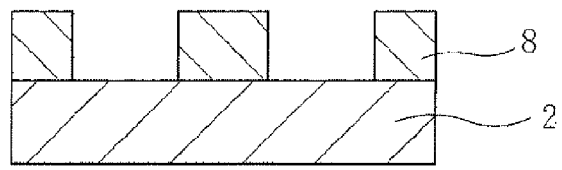
(b)
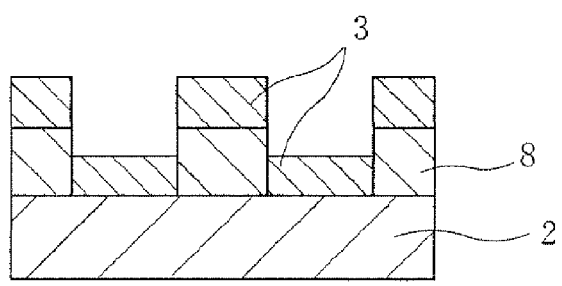
(c)
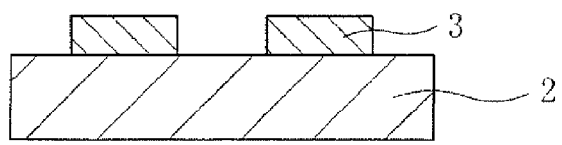
(d)
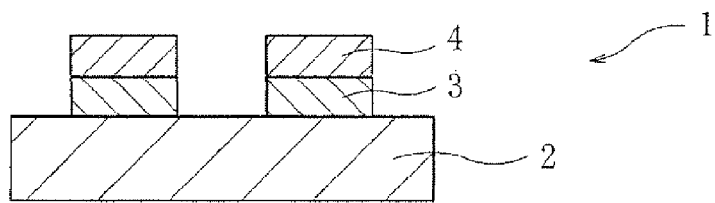

Fig. 14
(a) 
(b) 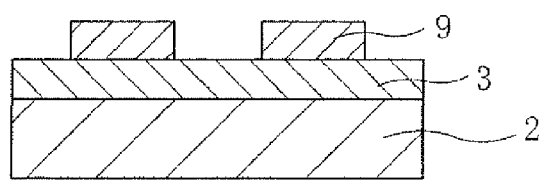
(c) 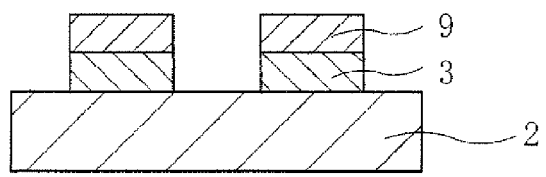
(d) 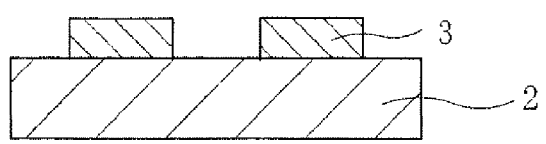
(e) 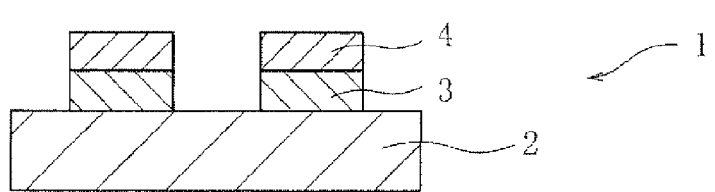

Fig. 16
(a)
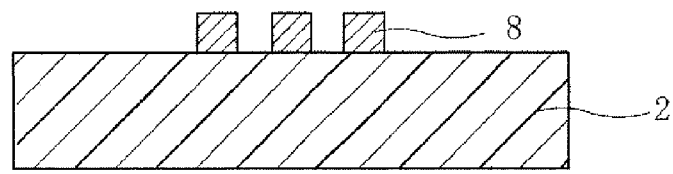
(b)
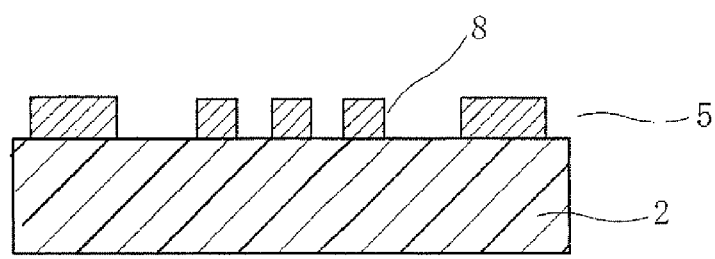
(c)
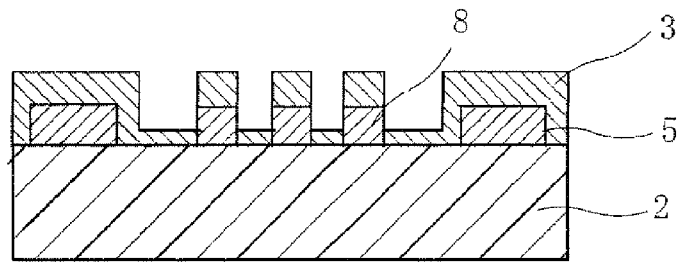
(d)
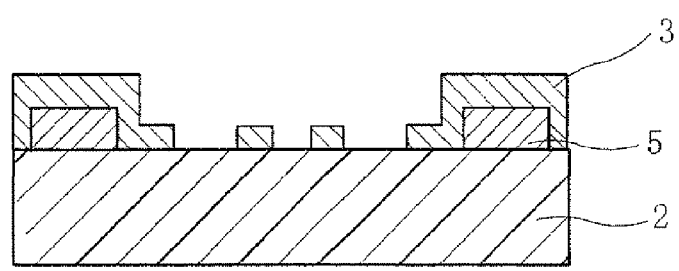
(e)
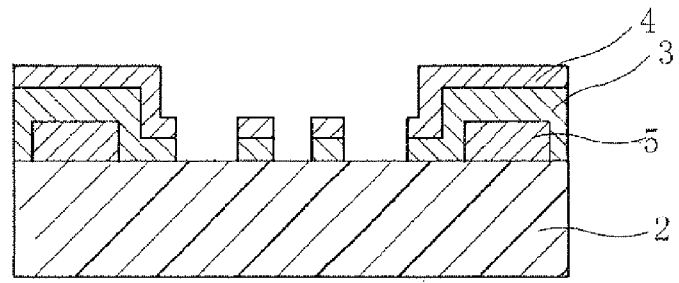

Fig. 17
(a) 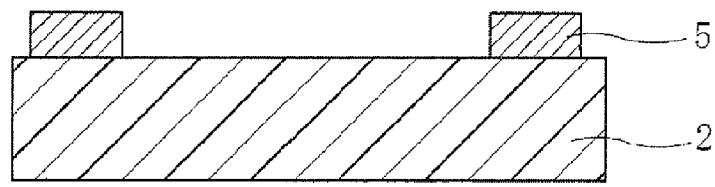
(b) 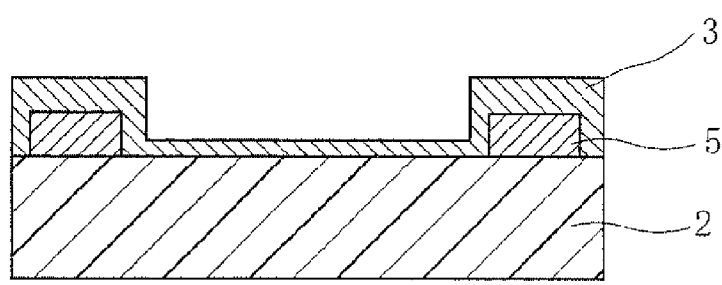
(c) 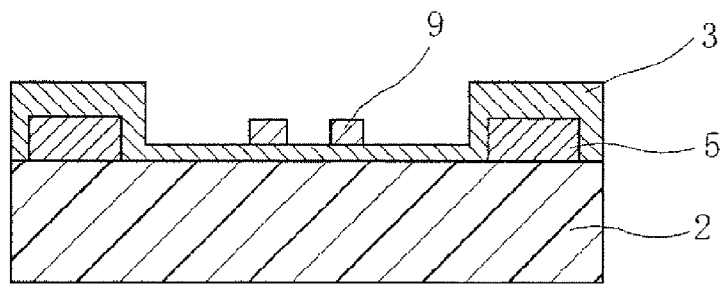
(d) 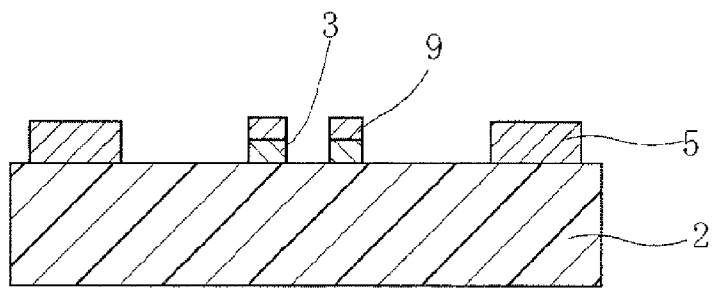
(e) 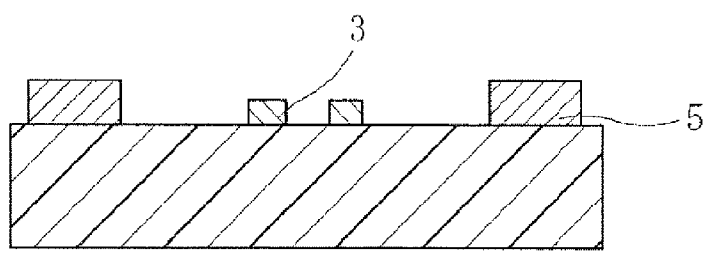

TRANSFER SHEET PROVIDED WITH TRANSPARENT CONDUCTIVE FILM MAINLY COMPOSED OF GRAPHENE, METHOD FOR MANUFACTURING SAME, AND TRANSPARENT CONDUCTOR

TECHNICAL FIELD

The present invention relates to a transfer sheet having a transparent conductive film layer, a method of manufacturing the same, and a transparent conductor, and particularly to a transfer sheet including, as a transparent conductive film layer, a transparent conductive film mainly composed of graphene, a manufacturing method of the same, and a transparent conductor.

BACKGROUND ART

Communication devices such as cellular phones, electronic information devices, LCD displays, solar cells, and the like require a transparent conductor having good transparency and good electrical conductivity. Further, in recent years, transparent conductors of two- and three-dimensional forms having flexibility allowing bending have been demanded in view of reduction in weight and size as well as request relating to design.

Indium Tin Oxide (ITO) is primarily used as a transparent conductive material of a transparent conductive film. However, direct patterning of the ITO to a three-dimensional form is technically difficult. Even when the ITO is patterned into a two-dimensional form and then is patterned into a three-dimensional form, an electrical conductivity lowers because the ITO is fragile and does not follow extension, contraction, bending, and the like of a transfer subject or target, so that it is technically difficult to manufacture the three-dimensional form having the transparency and the electrical conductivity. Further, the ITO contains indium that is rare earth so that problems occur in connection with resource depletion, stable supply, environmental load, and the like.

Therefore, an alternate material of the ITO has been studied, and Carbon NanoTubes (CNT), metal nano-wires, and the like have been mentioned as candidates thereof. Among them, the CNT has mechanical strength and flexibility, i.e., both the features required for the transparent conductive film having a three-dimensional form. However, when the CNTs are used, a three-dimensional network structure of a plurality of CNTs which serve as conductors and are in point-contact with each other needs to be formed in a binder fixing the CNTs for obtaining the electrical conductivity as the conductive material. For forming this network structure, for example, an application method requires many steps such as selection and adjustment of solvent and dispersant for solving and dispersing the CNTs into a solution (for example, Patent Literature 1).

Graphene is another ITO alternative material. The graphene is a two-dimensional substance having a honeycomb structure in which a carbon atom is joined to adjacent three carbon atoms. For patterning the graphene having a mechanical strength and flexibility similarly to the CNT, it is possible to employ a method of patterning the graphene while masking the graphene after film deposition. This method does not require complicated steps in contrast to the application method, and significantly differs from the CNT.

As a method of depositing a film of the graphene, there is a method in which a sheet-like Cu substrate (having a thickness of 15 μm, 25 μm) that is a catalyst is wound around a columnar reactor, Chemical Vapor Deposition (CVD) is performed at 1000° C. to deposit the substrate on the Cu substrate, adhesion to a long substrate allowing a roll-to-roll method is performed, and the Cu substrate is removed by etching (e.g., non-patent documents 1 and 2). However, this method requires many steps so that damages such as crease or breakage occur in the produced graphene film, resulting in a problem of lowering a property of the graphene. Accordingly, the inventors earnestly studied to attain the present invention of manufacturing a transfer sheet in which graphene is formed on a metal thin film layer serving as a catalyst without undergoing a transfer step causing a damage to a graphene layer.

CITATION LIST

Patent Literature

Patent Literature 1: Re-publication of PCT Internal Publication No. 2006-132254
Non-Patent Literature 1: K. S. Novoselvo, A. K. Geim et al., Science, 306, 666 (2004)
Non-Patent Literature 2: S. Bae et al., Nature Nanotech. 5, 574 (2010)

SUMMARY OF INVENTION

Technical Problem

The present invention has been made for solving the above problems, and provides a transfer sheet and a transparent conductor, each having graphene as a transparent conductive material.

Solution to Problems

For achieving the above object, the present invention provides a transparent conductor, a transfer sheet for producing the transparent conductor, and a manufacturing method of the same.

Means for solving the problem in the present invention will be described below.

In a first aspect of the present invention, there is provided a transfer sheet comprising:
a substrate sheet having releasability and smoothness;
a metal thin film layer formed partially or entirely on the substrate sheet to reflect the smoothness of the substrate sheet; and
a transparent conductive film layer formed on the metal thin film layer and mainly composed of graphene.

In a second aspect of the present invention, there is provided a transfer sheet comprising:
a substrate sheet having smoothness;
a metal thin film layer formed partially or entirely on the substrate sheet to reflect the smoothness of the substrate sheet;
a transparent conductive film layer formed on the metal thin film layer and mainly composed of graphene; and
a routing circuit pattern layer formed on a portion of the transparent conductive film layer.

In a 3rd aspect of the present invention, there is provided a transfer sheet comprising:
a substrate sheet having smoothness;
a metal thin film layer formed partially on the substrate sheet to reflect the smoothness of the substrate sheet;
a transparent conductive film layer formed on the metal thin film layer and mainly composed of graphene; and
a routing circuit pattern layer formed continuously from an end of the transparent conductive film layer over the substrate sheet along a form of an end surface of each of the transparent conductive film layer and the metal thin film layer.

In a fourth aspect of the present invention, there is provided a transfer sheet comprising:

a substrate sheet having smoothness;

a metal thin film layer formed partially on the substrate sheet to reflect the smoothness of the substrate sheet;

a transparent conductive film layer formed partially on the metal thin film layer and mainly composed of graphene; and a routing circuit pattern layer formed continuously from an end of the transparent conductive film layer over the metal thin film layer along a form of an end surface of the transparent conductive film layer.

In a fifth aspect of the present invention, there is provided a transfer sheet comprising:

a substrate sheet having smoothness;

a routing circuit pattern layer formed partially on the substrate sheet;

a metal thin film layer formed partially or entirely on the routing circuit pattern and in a region of the substrate sheet not provided with the routing circuit pattern to reflect the smoothness of the substrate sheet;

a transparent conductive film layer formed on the metal thin film layer and mainly composed of graphene; and a routing circuit pattern layer formed on the transparent conductive film layer and the substrate sheet.

In a sixth aspect of the present invention, there is provided a transfer sheet comprising:

a substrate sheet having smoothness;

a metal thin film layer formed partially or entirely on the substrate sheet to reflect the smoothness of the substrate sheet;

a routing circuit pattern layer formed on a portion of the metal thin film layer; and a transparent conductive film layer located adjacent to the routing circuit pattern layer, formed on the metal thin film layer, and mainly composed of graphene.

In a seventh aspect of the present invention, the metal thin film layer has a thickness of 0.01 μm to 1 μm.

In an eighth aspect of the present invention, a surface of the substrate sheet has an arithmetic average roughness (Ra) of 20 nm or less.

In a ninth aspect of the present invention, a release layer is arranged on the substrate sheet.

In a tenth aspect of the present invention, an adhesive layer is arranged on the metal thin film layer.

In an 11th aspect of the present invention, there is provided a manufacturing method of a transfer sheet, comprising:

forming a mask layer partially on a substrate sheet;

forming a metal thin film layer on the mask layer and the substrate sheet having releasability;

forming the metal thin film layer partially on the substrate sheet by peeling and removing the mask layer and the metal thin film layer formed on the mask layer with a solvent; and forming a transparent conductive film layer mainly composed of graphene on the metal thin film layer partially formed on the substrate sheet.

In a 12th aspect of the present invention, there is provided a manufacturing method of a transfer sheet, comprising:

forming a metal thin film layer on a substrate sheet;

forming a resist layer partially on the metal thin film layer to form a portion provided with the resist layer and a portion not provided with the resist layer on the metal thin film layer;

forming the metal thin film layer and the resist layer partially on the substrate sheet by peeling and removing the metal thin film layer on the portion not provided with the resist layer with a solvent;

exposing the metal thin film layer on a surface thereof by removing the resist layer with a solvent; and forming a transparent conductive film layer mainly composed of graphene on the metal thin film layer exposed on the surface thereof.

In a 13th aspect of the present invention, there is provided a manufacturing method of a transfer sheet, comprising:

pattern-forming a mask layer on a portion of a substrate sheet having smoothness;

forming a routing circuit pattern layer in a portion of a region of the substrate sheet not provided with the mask layer;

forming a metal thin film layer in a region of the substrate sheet not provided with the mask layer and the routing circuit pattern layer;

peeling and removing the mask layer together with a portion of the metal thin film layer formed on the mask layer to form partially the metal thin film layer on the substrate sheet; and forming a transparent conductive film layer mainly composed of graphene on the partially formed metal thin film layer and the routing circuit pattern layer.

In a 14th aspect of the present invention, there is provided a manufacturing method of a transfer sheet, comprising:

forming a routing circuit pattern layer on a portion of a substrate sheet having smoothness;

forming partially a mask layer either on the routing circuit pattern layer and in a region on the substrate sheet not provided with the routing circuit pattern layer, or only in a region on the substrate sheet not provided with the routing circuit pattern layer;

forming a metal thin film layer in a region on the substrate sheet not provided with the mask layer and the routing circuit pattern layer, on the mask layer, and on the routing circuit pattern layer;

forming partially the metal thin film layer on the substrate sheet by peeling and removing the mask layer together with a portion of the metal thin film layer formed on the mask layer; and forming a transparent conductive film layer mainly composed of graphene on the partially formed metal thin film layer and the transparent conductive film layer.

In a 15th aspect of the present invention, there is provided a manufacturing method of a transfer sheet, comprising:

partially forming a mask layer on a substrate sheet having smoothness;

forming a metal thin film layer both in a region on the substrate sheet not provided with the mask layer and on the mask layer;

forming a routing circuit pattern layer in a region of the substrate sheet provided with the metal thin film layer and not provided with the mask layer;

forming partially the metal thin film layer on the substrate sheet by peeling and removing the mask layer together with a portion of the metal thin film layer formed on the mask layer; and forming a transparent conductive film layer mainly composed of graphene on the partially formed metal thin film layer and the transparent conductive film.

In a 16th aspect of the present invention, there is provided a manufacturing method of a transfer sheet, comprising:

partially forming a mask layer on a substrate sheet having smoothness;

forming a metal thin film layer both on a region of the substrate sheet not provided with the mask layer and on the mask layer;

forming the metal thin film layer partially on the substrate sheet by peeling and removing the mask layer together with a portion of the metal thin film layer formed on the mask layer;

forming a transparent conductive film layer mainly composed of graphene on the partially formed metal thin film layer; and forming a routing circuit pattern layer on the transparent conductive film layer.

In a 17th aspect of the present invention, there is provided a manufacturing method of a transfer sheet, comprising:

partially forming a mask layer on a substrate sheet having smoothness;

forming a metal thin film layer both on a region of the substrate sheet not provided with the mask layer and on the mask layer;

forming the metal thin film layer partially on the substrate sheet by peeling and removing the mask layer together with a portion of the metal thin film layer formed on the mask layer;

forming a routing circuit pattern layer either in a region on the substrate sheet previously provided with the peeled and removed mask layer, or on the region and the metal thin film layer partially formed on the substrate sheet; and forming a transparent conductive film layer mainly composed of graphene on a portion of the metal thin film layer partially formed on the substrate sheet and not provided with the routing circuit layer.

In an 18th aspect of the present invention, there is provided a manufacturing method of a transfer sheet, comprising:

partially forming a routing circuit pattern layer on a substrate sheet having smoothness;

forming a metal thin film layer both on a region of the substrate sheet not provided with the routing circuit pattern layer and on the routing circuit pattern layer;

forming a resist layer on a portion of the metal thin film layer;

forming the metal thin film layer partially on the substrate sheet or the routing circuit pattern layer by peeling and removing the resist layer after removing the metal thin film layer on a portion not provided with the resist layer; and forming a transparent conductive film layer mainly composed of graphene on the metal thin film layer formed partially on the substrate sheet or on the routing circuit pattern layer.

In a 19th aspect of the present invention, there is provided a manufacturing method of a transfer sheet, comprising:

forming a metal thin film layer on a substrate sheet having smoothness;

partially forming a routing circuit pattern layer on the metal thin film layer;

partially forming a resist layer in a region of the metal thin film layer not provided with the routing circuit pattern layer;

partially forming the metal thin film layer on the substrate sheet by peeling and removing the resist layer after removing the metal thin film layer from a portion not provided with the resist layer; and forming a transparent conductive film layer mainly composed of graphene on the partially formed metal thin film layer.

In a 20th aspect of the present invention, there is provided a manufacturing method of a transfer sheet, comprising:

forming a metal thin film layer on a substrate sheet having smoothness;

forming a resist layer partially on the metal thin film layer;

forming the metal thin film layer partially on the substrate sheet by peeling and removing the resist layer after removing the metal thin film layer from a portion of the metal thin film layer not provided with the resist layer;

forming a transparent conductive film layer mainly composed of graphene on the metal thin film layer formed partially on the substrate sheet; and forming a routing circuit pattern layer on the transparent conductive layer.

In a 21st aspect of the present invention, there is provided a manufacturing method of a transfer sheet, comprising:

forming a metal thin film layer on a substrate sheet having smoothness;

forming a resist layer partially on the metal thin film layer;

partially forming the metal thin film layer on the substrate sheet by peeling and removing the resist layer after removing the metal thin film layer from a portion of the metal thin film layer not provided with the resist layer;

partially forming a routing circuit pattern layer on the metal thin film layer; and forming a transparent conductive film layer mainly composed of graphene in a region of the metal thin film layer not provided with the routing circuit pattern layer.

In a 22nd aspect of the present invention, there is provided a transparent conductive film product having one transparent conductive portion mainly composed of graphene, characterized by comprising:

a flexible transparent substrate of a two-dimensional form, a resin layer formed on one of surfaces of the transparent substrate; and the transparent conductive portion formed of a transparent conductive layer mainly composed of graphene formed on the resin layer, wherein the transparent conductive film product has one transparent conductive film portion and has flexibility.

In a 23rd aspect of the present invention, there is provided a transparent conductor having two transparent conductive portions mainly composed of graphene, characterized by comprising:

a flexible first transparent substrate of a two-dimensional form;

a first resin layer formed on one of surfaces of the first transparent substrate;

a first transparent conductive portion formed of a first transparent conductive layer formed on the first resin layer and mainly composed of graphene;

a flexible second transparent substrate of a two-dimensional form;

a second resin layer formed on one of surfaces of the second transparent substrate; and a second transparent conductive portion formed of a second transparent conductive layer formed on the second resin layer and mainly composed of graphene, wherein the first and second transparent conductive portions are opposed to each other to keep electrical isolation, and the transparent conductor is flexible and has a two-dimensional form.

In a 24th aspect of the present invention, there is provided a transparent conductive film product having one transparent conductive portion mainly composed of graphene, characterized by comprising:

a transparent substrate of a three-dimensional form;

a resin layer formed on one of surfaces of the transparent substrate; and a transparent conductive portion formed of a transparent conductive layer mainly composed of graphene and formed on the resin layer, wherein the transparent conductive film product has a three-dimensional form including the one transparent conductive portion.

In a 25th aspect of the present invention, there is provided a transparent conductor having two transparent conductive portions mainly composed of graphene, characterized by comprising:

a first transparent substrate of a three-dimensional form;

a first resin layer formed on one of surfaces of the first transparent substrate;

a first transparent conductive portion formed of a first transparent conductive layer mainly composed of graphene and formed on the first resin layer;

a second transparent substrate of a three-dimensional form;

a second resin layer formed on one of surfaces of the second transparent substrate; and a second transparent conductive portion formed of a second transparent conductive layer mainly composed of graphene and formed on the second resin layer, wherein the first and second transparent electrode portions are opposed to each other to keep electrical isolation, and the transparent conductor has a three dimensional form including the two transparent conductive portions.

In a 26th aspect of the present invention, the transparent conductor has an insulating layer between the first and second transparent conductive portions.

In a 27th aspect of the present invention, there is provided a transparent conductor includes a pressure conductive layer arranged between first and second transparent electrode portions, and made of an insulative transparent resin and a plurality of electrically conductive pressure-sensitive substances dispersed and contained in the transparent resin. When a force acts on one of surfaces of the transparent conductor, the acting force causes an electric current to flow between the pressure-sensitive substances in the pressure conductive layer to achieve conduction between the first and second transparent conductive layers opposed to each other.

In a 28th aspect of the present invention, the transparent conductor includes a routing circuit portion.

In a 29th aspect of the present invention, the routing circuit portion is located near the transparent electrode portion.

In a 30th aspect of the present invention, there is provided a manufacturing method of a transparent conductor, characterized by comprising:

a first step of arranging a transfer sheet provided with a transparent conductive portion mainly composed of graphene within injection molding dies, injecting molding resin, integrally adhering the transfer sheet to one of surfaces of a molded resin article simultaneously with solidification of the molding resin, and removing a releasable substrate sheet thereof; and a second step of removing a metal thin film layer formed on the one surface. In this manufacturing method of the transparent conductor, the transparent conductor includes one transparent electrode portion mainly composed of graphene and has flexibility.

In a 31st aspect of the present invention, there is provided a manufacturing method of a transparent conductor, characterized by comprising:

a first step of arranging a first transfer sheet provided with a first transparent conductive portion mainly composed of graphene within injection molding dies, injecting molding resin, integrally adhering the first transfer sheet to a first one surface among molded resin surfaces simultaneously with solidification of the molding resin, and removing a releasable substrate sheet thereof;

a second step of removing a first metal thin film layer formed on the first one surface;

a third step of integrally adhering a second transfer sheet provided with a second transparent conductive portion mainly composed of graphene to a second one surface of a flexible transparent substrate having a two-dimensional form by heat and pressure, and removing a releasable substrate sheet thereof; and a fourth step of removing a second metal thin film layer formed on the second one surface; and a fifth step of adhering the first and second one surfaces together by an adhesive in opposed positions to keep electrical isolation between the first and second transparent conductive portions, and forming a resin layer or a pressure-sensitive conductive layer between the first transparent conductive portion and the second conductive portion. The transparent conductor includes the two transparent conductive portions characterized by graphene and has a three-dimensional form.

In a 32nd aspect of the present invention, there is provided a capacitive touch input device contains a transparent conductor having a routing circuit portion located near the transparent electrode portion.

In a 33rd aspect of the present invention, there is provided a resistive film type touch input device contains a transparent conductor.

Advantageous Effects of Invention

In the transfer sheet of the present invention, the surface of the releasable substrate sheet surface is extremely smooth, and the metal thin film layer formed on the releasable substrate sheet has an extremely small thickness. Therefore, the metal thin film layer surface reflecting the smoothness of the substrate sheet surface necessarily becomes extremely smooth. Since the metal thin film layer that forms a base thereof and is a catalyst has the extremely smooth surface, generation of pinholes in the transparent conductive film layer formed thereon is suppressed so that the transparent conductive film layer can be formed stably even when the transparent conductive film layer has an extremely small thickness. Further, an effect of improving uniformity in thickness of the transparent conductive film layer itself can be achieved. Additionally, the graphene forming the transparent conductive film layer has a function that the graphene has an extremely high transparency.

Consequently, the use of the transfer sheet of the present invention achieves an effect of manufacturing the transparent conductor having good electrical conductivity and transparency. Improvement of the uniformity in thickness suppresses generation of crease and the like of the transparent conductive film layer at the time of transfer. Since the metal thin film layer has an extremely small thickness, this facilitates a step of removing the metal thin film layer after the adhesion to the transfer subject, resulting in an effect that the transparent conductor of high quality can be manufactured with high productivity.

Further, since the transfer sheet of the present invention uses the transparent conductive film layer mainly composed of the graphene having flexibility, the transparent conductive film layer can be formed on the flexible transfer subject of a two-dimensional form, and further can be formed on the transfer subject of a three-dimensional form. This results in an effect of increasing application fields and functions of the portable electronic instruments equipped with the transparent conductor. Since the metal thin film layer can be patterned in the stage of forming the transfer sheet, the patterned transparent conductive film layer can be obtained only by removing the metal thin film layer after the formation on the transfer subject. Therefore, a step of patterning the transparent conductive film layer is not required after the formation on the transfer subject, resulting in an effect of significantly simplifying the steps.

Further, the routing circuit of the transfer sheet of the present invention is also formed through patterning. Therefore, steps of forming and patterning the routing circuit after the formation on the transfer subject are not required, resulting in an effect of significantly simplifying the steps. Since the routing circuit is formed in advance on the transfer sheet, the routing circuit can be formed on the flexible transfer subject as well as the transfer subject of a three-dimensional form. Further, the routing circuit is formed as a part of a transfer layer on the substrate sheet surface that is very smooth and has releasability, the surface after the transferring and formation on the transfer subject is flush, which achieves an effect of improving the performance such as an abrasion resistance and improving designability.

Further, the transparent conductor of the present invention is obtained merely by preparing the patterned transparent conductive film layer made of the two-dimensional sheet-like transfer sheet, then integrating it with the transfer subject to perform simultaneous molding and transferring, and removing the metal thin film layer. Therefore, effect of good mass-productivity is achieved.

Further, in the formation of the transparent conductive film layer mainly composed of graphene, the graphene is formed on the metal thin film layer patterned on the transfer sheet through CVD. Therefore, patterning with high-energy light irradiation of, e.g., an electron beam is not required after the whole film deposition. Further, the layers containing the transparent conductive film can be transferred merely by transferring the transfer sheet to the desired transfer subject. Therefore, the graphene can be produced without a load more than necessary, and the transparent conductor having good quality and good productivity can be provided.

BRIEF DESCRIPTION OF DRAWINGS

FIG. 5 is a cross section view of a transfer sheet of the present invention;
FIG. 6 is a cross section view of a transfer sheet of the present invention;
FIG. 11 is a cross section view of a transfer sheet of the present invention;
FIG. 12 is a cross section view of a transfer sheet in a transfer sheet manufacturing step of the present invention;
FIG. 13 is a cross section view of a transfer sheet in a transfer sheet manufacturing step of the present invention;
FIG. 14 is a cross section view of a transfer sheet in a transfer sheet manufacturing step of the present invention;
FIG. 16 is a cross section view of a transfer sheet in a transfer sheet manufacturing step of the present invention;
FIG. 17 is a cross section view of a transfer sheet in a transfer sheet manufacturing step of the present invention.

DESCRIPTION OF EMBODIMENTS

Embodiments of the present invention will be described below in detail with reference to the drawings. Sizes, materials, forms, and relative positions of parts and portions described in the embodiments of the present invention are not intended to restrict the scope of the present invention to them unless otherwise described, and are mere illustration examples.

Figure 1:
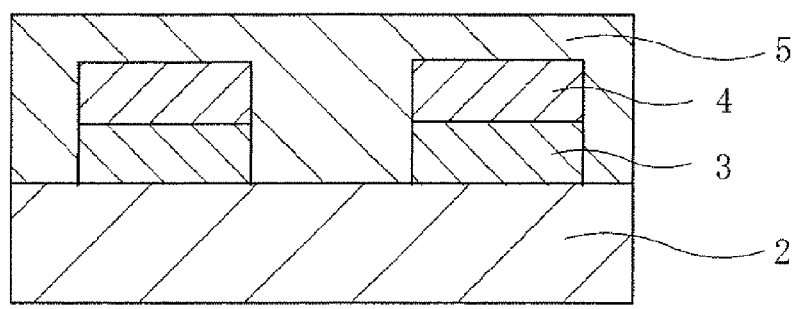
FIG. 1 is a cross section view of a transfer sheet of the present invention.

FIG. 1 is a view showing a transfer sheet according to a first embodiment of the present invention. Here, the transfer sheet is a sheet that can transfer layers including a transparent conductive film layer by pressing, heating, or the like to a transfer subject of a two-dimensional form or a three-dimensional form. Referring to FIG. 1, a transfer sheet 1 of the present invention is formed of a substrate sheet 2, a metal thin film layer 3, a transparent conductive film layer 4, and an adhesive layer 5. The transfer sheet 1 of the present invention has the metal thin film layer 3 formed partially on the substrate sheet 2, and the transparent conductive film layer 4 is formed along the metal thin film layer 3. The adhesive layer 5 is arranged on the outermost surface.

[Substrate Sheet]

The substrate sheet is employed for carrying the metal thin film layer and the transparent conductive film layer. A surface of the substrate sheet has good smoothness and releasability. An arithmetic average roughness (Ra) of the surface of the substrate sheet is preferably in a range of (0.1 nm≤Ra≤20 nm). When the arithmetic average roughness (Ra) of the substrate sheet is larger than 20 nm, the metal thin film layer formed on the substrate sheet has large irregularities. Consequently, graphene produced on the metal thin film layer has relatively small grain sizes and therefore low crystallinity, resulting in a problem that the transparent conductive film layer mainly composed of the graphene has a low conductivity. Conversely, when the arithmetic average roughness (Ra) is lower than 0.1 nm, the irregularities of the substrate sheet surface cannot be uniform. Consequently, the substrate sheet has low releasability, resulting in a problem that the transparent conductive film layer cannot be transferred to the transfer subject. The arithmetic average roughness (Ra) is inconformity with the Japanese Industrial Standards (JIS) B0601-1994.

The substrate sheet preferably has a thickness of 10 μm to 500 μm. When the substrate sheet has the thickness smaller than 10 μm, the substrate sheet 2 loses rigidity, resulting in a problem that the substrate sheet 2 cannot hold the metal thin film layer and the transparent conductive film layer when the metal thin film layer and the transparent conductive film layer are formed on the substrate sheet. However, a correlation is present between the thickness of the substrate sheet and the surface irregularities. Therefore, when the thickness of the substrate sheet exceeds a certain thickness, i.e., when the thickness of the substrate sheet exceeds 500 µm, the surface form of the substrate sheet has a surface of the arithmetic roughness (Ra) exceeding 20 nm, which causes the foregoing problem.

The material of the substrate sheet is not particularly restricted as long as the material has a heat resistance against heat that occurs when the transparent conductive film layer is formed as will be described later. A material having such heat resistance is, e.g., resin such as polyaramid, polyimide, polyether-imide, polysulfone, polyether sulfone, polyether ether ketone, polyphenylene sulfide, polyethylene naphthalate, polyimide-imide, polyallylate, high density polyolefin, polycarbonate, polyethylene terephthalate, polybutylene terephthalate, polyvinylidene fluoride, polyvinyl fluoride, polyvinylidene chloride, or liquid crystal polymer; or is glass such as soda glass.

When the material forming the substrate sheet does not have the releasability, releasing processing may be applied to the substrate sheet. A manner of performing the releasing processing on the substrate sheet may be (1) a manner of performing low-pressure plasma processing on the substrate sheet in an atmosphere of a fluorohydrocarbon-based compound, (2) a manner of performing discharge plasma on the substrate sheet in an atmospheric of argon and one or both of acetone and helium, or (3) a manner of performing the releasing processing on the substrate sheet under an atmospheric pressure of a gas mixture of a gas containing fluorine atoms and an inert gas by arranging solid dielectrics on opposed electrode surfaces and using a discharge plasma generated by applying an electric field across the opposed electrodes.

[Metal Thin Film Layer]

The metal thin film layer is a layer having a catalyst function for producing, on the substrate sheet, the graphene that is a main component of the transparent conductive layer, and a function of reflecting the smoothness of the substrate sheet on the metal thin film layer. The material of the metal thin film layer is metal such as copper, nickel, ruthenium, iron, cobalt, iridium, platinum, or the like, alloy thereof, or the like. From the viewpoint of reflecting the smoothness of the substrate sheet on the metal thin film layer, the metal thin film layer of the present invention preferably has a thickness of 0.01 µm to 1 µm.

When the metal thin film layer has the thickness in a range of 0.01 µm to 1 µm, it is possible to reflect the smoothness of the substrate sheet. Therefore, the metal thin film layer has a smooth surface. As a result, since the graphene forming the transparent conductive film layer has relatively large grain sizes, a graphene film of a good conductivity can be formed. When the metal thin film layer has the thickness in a range of 0.01 µm to 1 µm in the case of using the transfer sheet and producing the transparent conductor made of the transfer subject and the transparent conductive film layer, the metal thin film layer has a thickness remarkably smaller than a conventional thickness (15 µm, 25 µm) and therefore the metal thin film layer can be removed within a short time in a step of transferring the metal thin film layer and the transparent conductive film layer from the transfer sheet to the transfer subject and removing only the metal thin film layer from the transfer subject.

It is technically difficult to form a uniform film having a metal thin film layer thinner than 0.01 µm. Conversely, when the metal thin film layer is thicker than 1 µm, it is difficult to reflect the smoothness of the substrate sheet, and the metal thin film layer is liable to have large irregularities. Consequently, large variations occur in thickness of the transparent conductive layer formed on the metal thin film layer, resulting in problems such as unstable conductivity and occurrence of defects such as pin holes. Further, in the case of producing the transparent conductor formed of the transfer subject and the transparent conductive film layer using the transfer sheet, and particularly in one of manufacturing steps for it, i.e., when the metal thin film layer and the transparent conductive film layer are transferred from the transfer sheet to the transfer subject, and only the metal thin film layer is removed from the transfer subject, a problem of requiring more time for removing the metal thin film layer occurs if the metal thin film layer is thicker than 1 µm, It can be considered that when the metal thin film layer is constructed as described above, the catalyst activity of the metal promotes the chemical reaction to produce the graphene film so that the graphene film along the form of the metal surface is formed. Further, it can be considered as follows. If the metal thin film layer described above is not constructed, the smoothness of the underlying metal thin film layer affects the smoothness of the graphene film. Therefore, membered rings or the like occur for the energy stabilization in bending portions and the like of the graphene film that is not smooth, and the conductivity lowers.

It can also be considered that when the metal thin film layer is not formed, the surface of the metal thin film layer is not physically flat so that the carriers, i.e., electrons scatter to lower the conductivity. A method of forming the metal thin film layer may be a sputtering method, a vapor deposition method, an ion-plating method, or the like.

[Transparent Conductive Film Layer]

The transparent conductive film layer is a layer mainly composed of the graphene. The fact that a main ingredient is the graphene means that one or a plurality of graphene films occupy the largest weight ratio among substances configuring the transparent conductive film layer. The transparent conductive film layer may contain an impurity. The impurity is amorphous carbon, metal of the metal thin film layer, or the like. The metal of the metal thin film layer is a component remaining in an etching step after the transfer to the transfer subject. The transparent conductive film layer has a conductivity, and is configured such that a light transmittance of a wavelength in a visible range is 80% or more as a whole. The transparent conductive film layer preferably has a thickness from 2 nm to 200 nm. This is because the thickness larger than 200 nm impedes the transparency of the transparent conductive film layer, and the thickness lower than 2 nm lowers the conductivity of the transparent conductive film layer 4. The transparent conductive film layer is formed by a Chemical Vapor Deposition (CVD) or the like on only the patterned metal thin film layer.

[Adhesion Layer]

The adhesive layer is a layer for adhering the transfer subject to the transfer sheet, and is formed on the surface of the transfer sheet when required. The adhesive layer is made of acrylic, vinyl resin, or the like, and has an insulation property. This insulation property means insulation property of a degree preventing at least short-circuit which is a cause of a malfunction in the position detection when an input operation is performed on a touch panel formed by including the transparent conductor manufactured according to the present invention. The adhesive layer is formed on the transfer sheet by a gravure coat method, a roll coat method, a comma coat method, a gravure print method, a screen print method, an offset print method, or the like.

Figure 2:
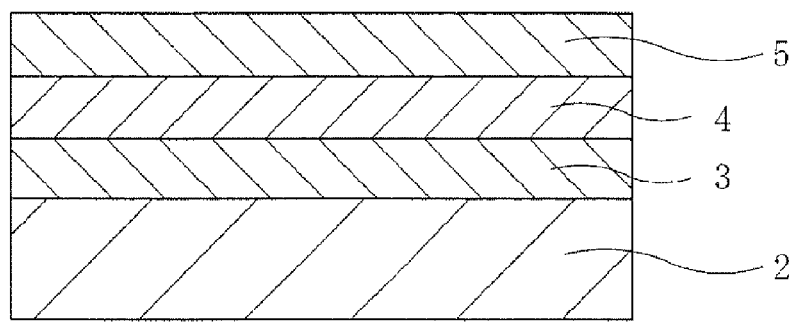
FIG. 2 is a cross section view of a transfer sheet of the present invention.

FIG. 2 is a view showing a modification of a transfer sheet according to the first embodiment. Since the transfer sheet has the same basic configuration as the transfer sheet of the first embodiment, only differences will be described below. Referring to FIG. 2, a metal thin film layer 3 and a transparent conductive film layer 4 may be formed on a whole surface of the substrate sheet 2.

Figure 3:
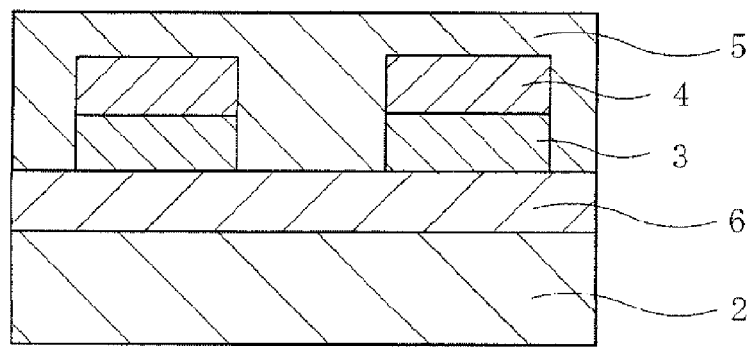
FIG. 3 is a cross section view of a transfer sheet of the present invention.

FIG. 3 is a view showing a transfer sheet according to a second embodiment of the present invention. Since the transfer sheet has the same basic configuration as the transfer sheet of the first embodiment, only differences will be described below.

[Release Layer]

Referring to FIG. 3, the transfer sheet of the second embodiment includes a release layer 6 between a transparent conductive film layer 3 and a substrate sheet 2. The release layer 6 is peeled together with the substrate sheet 2 from a transfer subject when the substrate sheet 2 is peeled off from the transfer subject after the transparent conductive film layer 4 and the like are transferred to the transfer subject using the transfer sheet 1, and the release layer 6 is formed on the substrate sheet 2. By forming the release layer on the substrate sheet, a peeling weight of the substrate sheet (i.e., a force required for peeling) can be adjusted. Additionally, in a case where the release layer is formed on the substrate sheet, even when the surface of the substrate sheet has irregularities, the release layer covers the substrate sheet to fill the irregularities of the substrate sheet surface. Therefore, the release layer surface on which the metal thin film layer is formed can have a surface of the arithmetic roughness (Ra) of ($1\ nm \leq Ra \leq 20\ nm$). The release layer is formed even though the substrate sheet has irregularities on its surface. As a result, this can prevent, similarly to the transfer sheet of the first embodiment, such problems that the conductivity of the transparent conductive film layer mainly composed of the graphene lowers, and that the releasing property of the release layer lowers. The material of the release layer is not particularly restricted as long as the material has a predetermined releasing property and a heat resistance against heat generating at the time of formation of the transparent conductive film layer, and can provide the surface of the release layer having good smoothness when the release layer is formed on the substrate sheet. A material of the release layer may be thermosetting acrylic, thermosetting polyester, thermosetting urethane, acrylic, epoxy, melamine, silicone, fluorine, or the like. A formation method of the release layer may be application by a roll coat method, a gravure print method, a screen print method, a die coat method, or the like.

Figure 4:
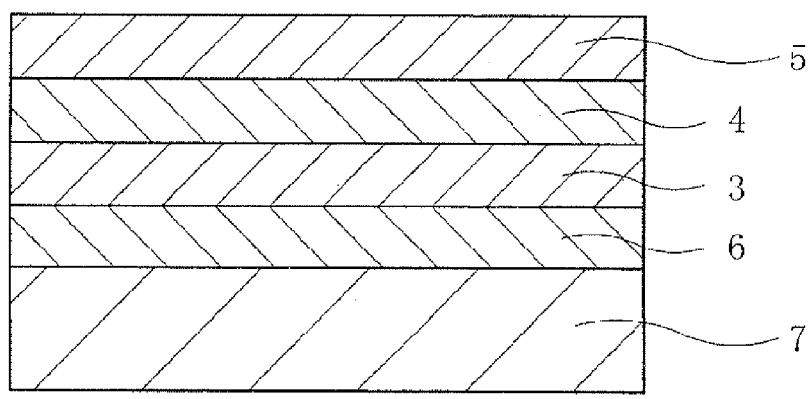
FIG. 4 is a cross section view of a transfer sheet of the present invention.

FIG. 4 is a view showing a modification of the transfer sheet according to the second embodiment. Since the transfer sheet has the same basic configuration as the transfer sheet of the second embodiment, only differences will be described below. Referring to FIG. 4, a release layer 6, a metal thin film layer 3 and a transparent conductive film layer 4 may be formed on a whole surface of a substrate sheet 2.

FIG. 5 is a view showing a transfer sheet according to a third embodiment of the present invention. Since the transfer sheet has the same basic configuration as the transfer sheet of the second embodiment, only differences will be described below.

Referring to FIG. 5, a transfer sheet 1 has a routing circuit pattern layer 5 which extends continuously from an end of a transparent conductive film layer 4 over a substrate sheet 2 along forms of end surfaces of a transparent conductive film layer 4 and a metal thin film layer 3. An adhesive layer 7 is formed over a whole surface of the respective layers. When the transfer sheet has the structure described above, the transferred routing circuit pattern layer 5 is formed of a portion coated with the metal thin film layer 3 and the transparent conductive film layer 4 and a portion exposed at the surface. In the coated portion, the transparent conductive film layer 4 protects the routing circuit pattern layer 5. This results in an advantage of preventing corrosion of the routing circuit pattern layer 5 when the metal thin film layer 3 is removed by the etching or the like. In the exposed portion, such an advantage is achieved that direct electrical connection to an external circuit can be performed after the transfer.

[Routing Circuit Pattern Layer]

The routing circuit pattern layer is a layer for transmitting electric signals detected by the transparent conductive film layer to an external circuit. A material thereof may be metal such as gold, silver, copper, aluminum, nickel, or palladium; or electrically conductive ink containing powder of such metal; and also may be an electrically conductive substance containing an organic conductive material of carbon or the like. The routing circuit pattern layer may be formed by a print method such as screen print, gravure print, ink-jet print, or letterpress print.

FIG. 6 is a view showing a modification of the transfer sheet of the third embodiment. Since the transfer sheet has the same basic configuration as the transfer sheet of the third embodiment, only differences will be described below.

Referring to FIG. 6, a transfer sheet has a routing circuit pattern layer 5 which extends from an end of a transparent conductive film layer 4 over a metal vapor-deposited layer 3 along a form of an end surface of the transparent conductive film layer 4. When the transfer sheet has the structure described above, the transferred routing circuit pattern layer 5 is formed of a portion coated with the metal thin film layer 3 and the transparent conductive film layer 4 and a portion coated with only the metal thin film layer 3. In the portion coated with the metal thin film layer 3 and the transparent conductive film layer 4, the transparent conductive film layer protects the routing circuit pattern layer. This results in an advantage that corrosion of the routing circuit pattern layer can be prevented when the metal thin film layer 3 is removed by etching or the like. The portion coated with only the metal thin film layer 3 can provide an advantage that when the etching or the like removes the metal thin film layer, the routing circuit pattern layer is exposed so that direct electrical connection to an external circuit can be performed.

Figure 7:
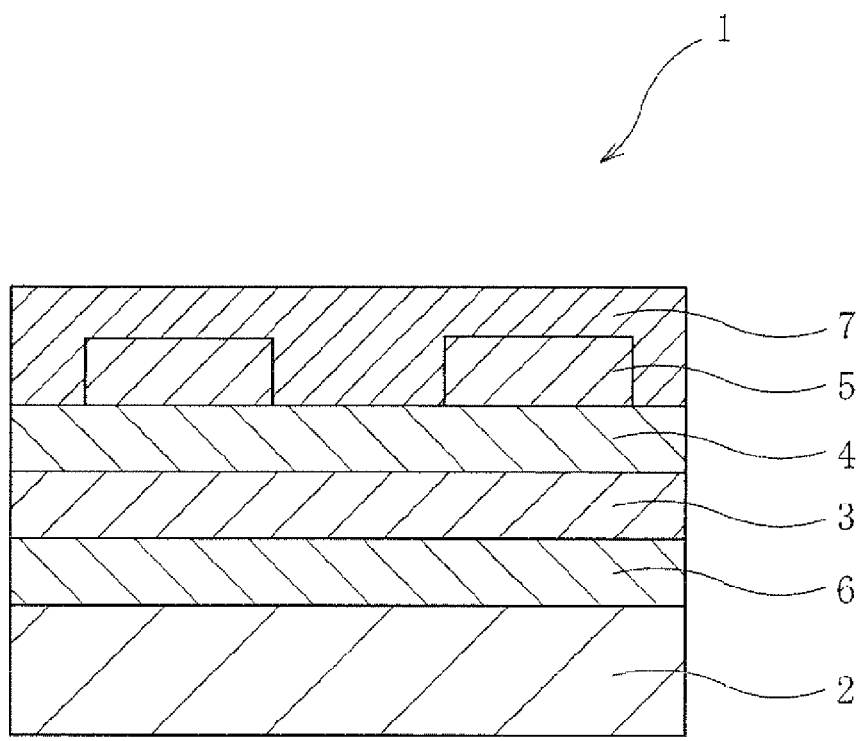
FIG. 7 is a cross section view of a transfer sheet of the present invention.

FIG. 7 is a view showing a transfer sheet according to a fourth embodiment of the present invention. Referring to FIG. 7, a transfer sheet 1 has a structure in which a release layer 6, a metal vapor-deposited layer 3, and a transparent conductive film layer 4 are formed over a whole surface of a substrate sheet 2, and a routing circuit pattern layer 5 is partially formed on the transparent conductive film layer 4. The adhesive layer 7 is formed over a whole surface of the transfer sheet 1.

Referring to FIG. 7 again, when the transfer sheet 1 has the above structure, the transferred routing circuit pattern layer is entirely coated with the transparent conductive film layer. Therefore, the transparent conductive film layer protects the routing circuit pattern layer, resulting in an advantage that the corrosion of the routing circuit pattern layer can be prevented when the metal thin film layer 3 is removed by the etching or the like. However, the transparent conductive film layer is interposed in electric connection to an external circuit so that particular attention must be paid to prevent increasing of a contact resistance value.

Figure 8:
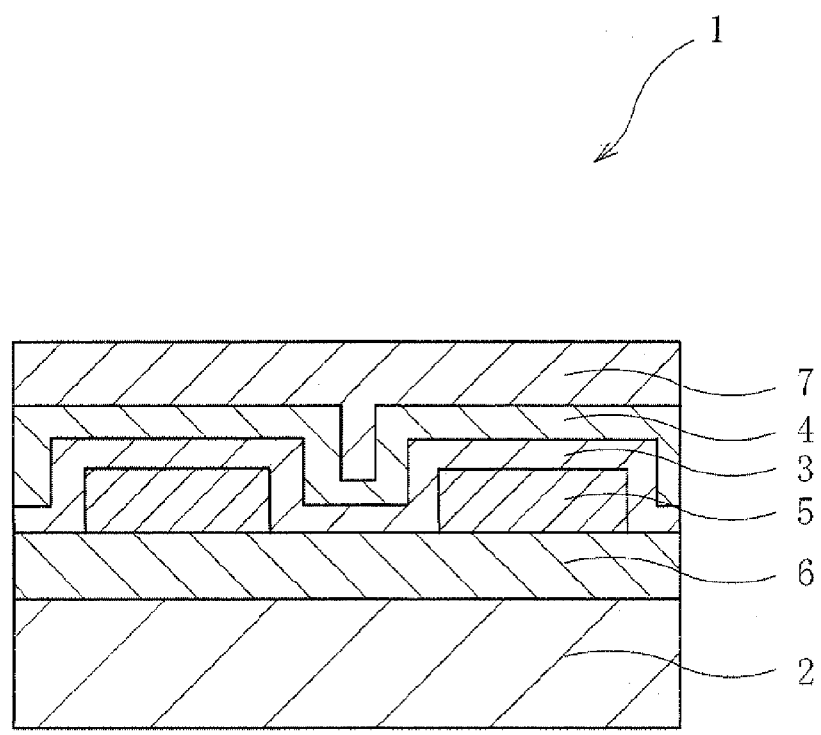
FIG. 8 is a cross section view of a transfer sheet of the present invention.

FIG. 8 is a view showing a transfer sheet according to a fifth embodiment. Since the transfer sheet has the same basic configuration as the transfer sheet of the fourth embodiment, only differences will be described below.

Referring to FIG. 8 again, a transfer sheet 1 according to the fifth embodiment of the present invention differs from the transfer sheet according to the fourth embodiment in that a routing circuit pattern layer 5 is formed between a release layer 6 and a metal thin film layer 3. Since the routing circuit pattern layer is formed between the release layer and the metal thin film layer as described above, the transferred routing circuit pattern layer is entirely exposed on the surface. Therefore, a whole of the transferred routing circuit pattern layer can be electrically connected to an external circuit, resulting in an advantage that a position of the terminal can be selected from a wide range when the routing circuit pattern layer is handled as a terminal, and therefore easy electrical connection is allowed.

Figure 9:
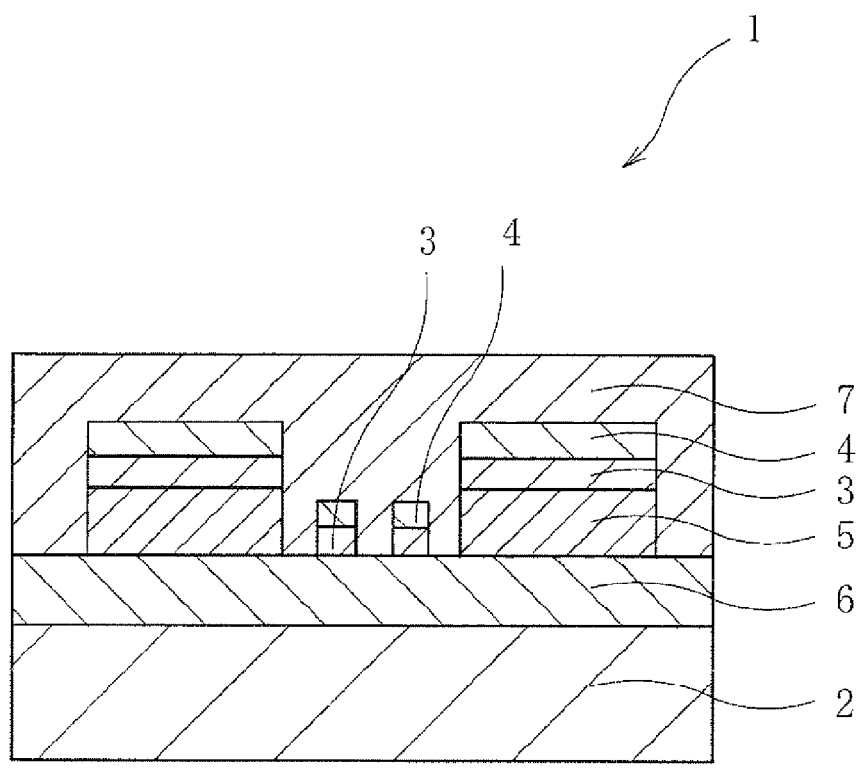
FIG. 9 is a cross section view of a transfer sheet of the present invention.

FIG. 9 is a view showing a modification of the transfer sheet of the fourth embodiment. Since the transfer sheet has the same basic configuration as the transfer sheet of the fifth embodiment, only differences will be described below.

Referring to FIG. 9 again, a transfer sheet 1 differs from the transfer sheet 1 of the fourth embodiment in that a metal thin film layer 3 and a transparent conductive film layer 4 are formed independently of each other on a substrate sheet 2. When the transfer sheet has the above configuration, the patterned transparent conductive layer can be obtained only by removing the metal thin film layer after the transfer so that it is not necessary to pattern the transparent conductive film layer 4 after the transfer, resulting in an advantage that the productivity can be significantly improved.

Figure 10:
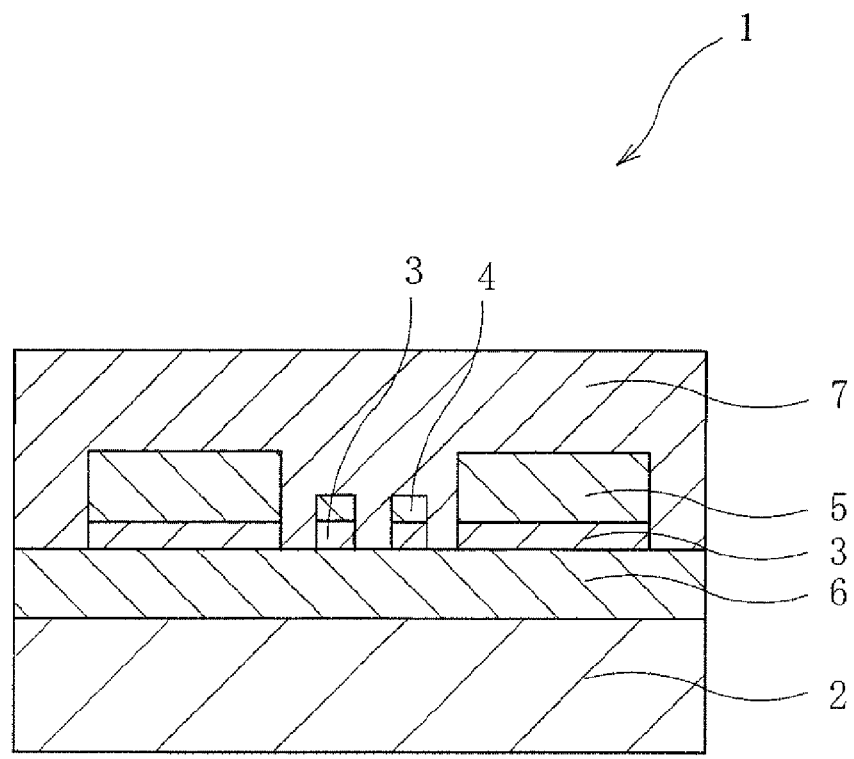
FIG. 10 is a cross section view of a transfer sheet of the present invention.
Figure 1:
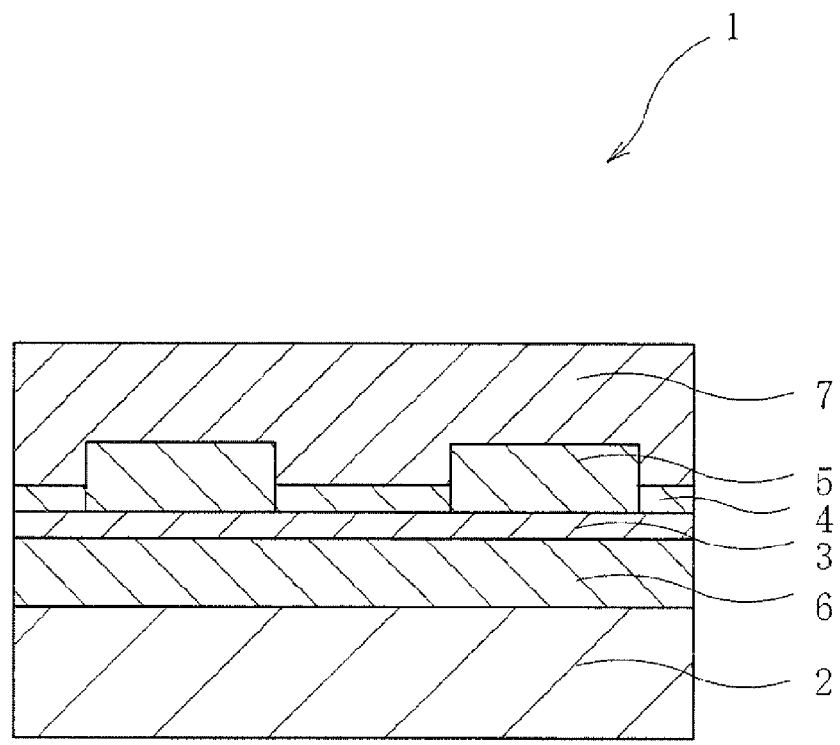
Figure 1:
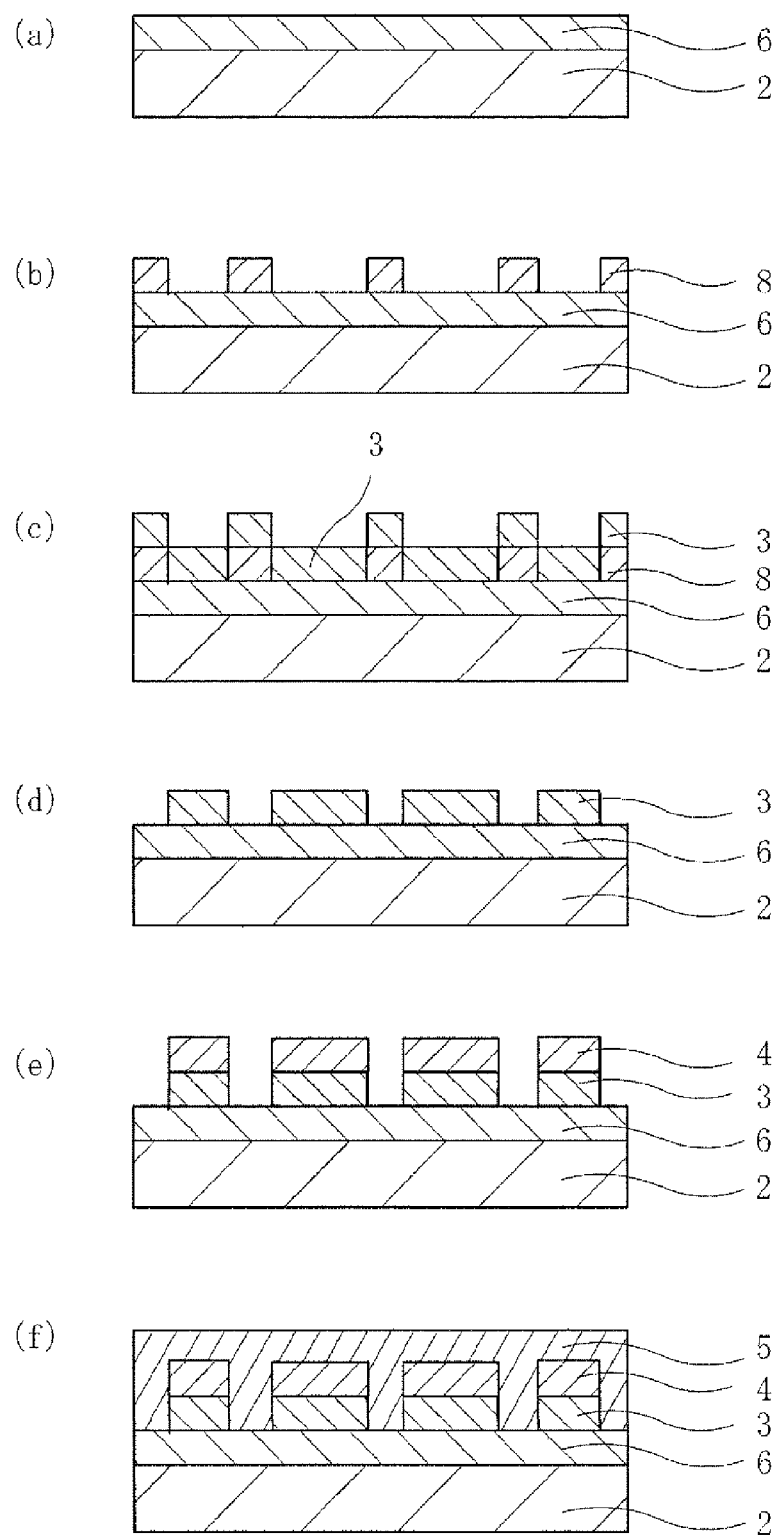

FIG. 10 is a view showing a transfer sheet according to a sixth embodiment. Since the transfer sheet has the same basic configuration as the transfer sheet of the fourth embodiment, only differences will be described below.

Referring to FIG. 10 again, a transfer sheet 1 according to the sixth embodiment is formed of a substrate sheet 2, a release layer 6, a metal thin film layer 3, a transparent conductive film layer 4, a routing circuit pattern layer 5, and an adhesive layer 7. The transfer sheet 1 of the sixth embodiment differs from the transfer sheet 1 of the fourth embodiment in that the metal thin film layer 3 is formed under the routing circuit pattern layer 5, and the transparent conductive film layer 4 is located adjacent to the routing circuit pattern layer 5 and is formed on the metal thin film layer 3. Since the metal thin film layer is formed under the routing circuit pattern layer, and the transparent conductive film layer is located adjacent to the routing circuit pattern layer and is formed on the metal thin film layer as described above, the patterned transparent conductive layer can be obtained only by removing the metal thin film layer after the transfer. Consequently, it is not necessary to pattern the transparent conductive film layer after the transfer, resulting in an advantage that the productivity can be significantly improved. Also, a terminal for electrical connection to an external circuit can be formed only by removing the metal thin film layer after the transfer, resulting in an advantage that a position of the terminal can be selected from a wide range, and easy electrical connection is allowed.

FIG. 11 is a view showing a transfer sheet according to a seventh embodiment of the present invention. Since the transfer sheet has the same basic configuration as the transfer sheet of the fourth embodiment, only differences will be described below.

Referring to FIG. 11 again, a transfer sheet 1 according to the seventh embodiment is formed of a substrate sheet 2, a release layer 6, a metal thin film layer 3, a transparent conductive film layer 4, a routing circuit pattern layer 5, and an adhesive layer 7. The transfer sheet 1 according to the seventh embodiment differs from the transfer sheet 1 according to the fourth embodiment in that the transparent conductive film layer 4 is located adjacent to the routing circuit pattern layer 5 and is formed on the metal thin film layer 3.

According to the above configuration of the transfer sheet, when the metal thin film layer is removed by etching or the like, a whole surface of the transferred routing circuit pattern layer is exposed. Therefore, the transferred routing circuit pattern layer can be entirely used as a terminal for electrical connection to an external circuit, resulting in an advantage that a position of the terminal can be selected from a wide range, and therefore easy electrical connection is allowed.

A manufacturing method of the transfer sheet will be described below.

FIG. 12 shows a manufacturing method of the transfer sheet of the first embodiment. Referring to FIG. 12, the manufacturing method of the transfer sheet includes a step of partially forming a mask layer 8 on the substrate sheet 2, a step of forming the metal thin film layer 3 on the substrate sheet 2 and the mask layer 8; a step of peeling and removing the mask layer 8 and the metal thin film layer 3 formed on the mask layer 8 with a solvent to form the metal thin film layer 3 partially on the substrate sheet 2, and a step of forming the transparent conductive film layer 4 mainly composed of graphene on the metal thin film layer partially formed on the substrate sheet 2.

Referring to FIG. 12(*a*), the first step of the manufacturing method of the transfer sheet according to the present invention partially forms the mask layer 8 on the substrate sheet 2.

The mask layer of the present invention is a layer that is soluble in a solvent. A material of the mask layer is Poly-Vinyl Alcohol (PVA), water-soluble acryl resin, or the like. The solvent is aqueous solution, alcoholic solution, or the like. A forming method is a print method such as offset print, screen print, gravure print, ink-jet print, or letterpress print. These methods have features that steps are fewer than those of a photoresist method to be described later.

Referring to FIG. 12(*b*), the second step includes a step of forming the metal thin film layer 3 on the mask layer 8 and the releasable substrate sheet 2. In the case of forming the metal thin film layer 3, the metal thin film layer 3 is formed on the whole surface of the substrate sheet 2 by the sputtering method, vapor deposition method, ion-plating method, or the like.

Referring to FIG. 12(*c*), the third step removes the metal thin film layer 3 formed on the mask layer 8 by solvent cleaning to form the metal thin film layer 3 partially on the substrate sheet 2 and the mask layer 8. An aqueous solution, alcohols, or the like is often used as the solvent.

Referring to FIG. 12(*d*), the fourth step includes a step of forming the transparent conductive film layer 4 mainly composed of the graphene on the metal thin film layer 3. The method of forming the transparent conductive film layer 4 mainly composed of the graphene on the metal thin film layer 3 is preferably a Chemical Vapor Deposition (CVD) method, and a microwave plasma CVD method is preferable among the chemical vapor deposition methods.

When the microwave plasma CVD is used, it is possible to control a distribution of energy density of the generated plasma and to perform film deposition of the graphene, using the microwave plasma under conditions of relatively low pressure and low temperature. Therefore, it is possible to reduce damages on the substrate sheet 2 holding the transparent conductive film layer. Further, a side of the releasable substrate sheet 2 opposite to the side on which the graphene is deposited is cooled. This can also reduce the damages on the substrate sheet. Since the transparent conductive film layer can be formed on the substrate sheet via the metal thin film layer located therebetween under the condition of a relatively low temperature, a flexible film can be used as the substrate sheet. This allows employment of a roll-to-roll system in the formation of the transparent conductive film layer, and all the steps for manufacturing the transfer sheet can employ the roll-to-roll system so that the productivity of the transfer sheet remarkably increases.

A material gas of the microwave plasma CVD is a mixture of carbon hydride and noble gas, or the like. The carbon hydride is, e.g., methane ($CH_4$), ethane ($C_2H_6$), propane ($C_3H_8$), acetylene ($C_2H_2$), or the like, and the noble gas is, e.g., helium (He), neon (Ne), argon (Ar), or the like. In a state where a pressure in a chamber of the CVD device is reduced, a total pressure by a gas mixture in the device is set to a range from 10 Pa to 400 Pa. When the total pressure of the gas mixture in the device is lower than 10 Pa, a problem of slow reaction progression occurs. Conversely, when the total pressure of the gas mixture in the device is higher than 400 Pa, a problem of temperature rising in the chamber occurs. A small amount of hydrogen may be mixed into this gas mixture. Since the energy density of the plasma can be controlled as already described, the total pressure attained by the gas mixture in the device can be kept relatively low by appropriately setting the energy density only in a required spaced. Thereby, the temperature in the chamber can be kept relatively low, and the heating of the transfer sheet to be manufactured can be suppressed. The temperature in the chamber of the CVD device is in a range from 200° C. to 400° C. When the temperature in the chamber is lower than 200° C., there occurs a problem of lowering the crystallinity of the produced graphene Conversely, when the temperature in the chamber is higher than 400° C., there occurs a problem of extension, shrinkage and the like of the substrate sheet due to a high temperature.

The processing in the first to fourth steps produces the transfer sheet. Also, the above processing can directly form the transparent conductive film mainly composed of the patterned graphene on the transfer sheet. Therefore, the patterning step by the oxidation etching or an electron beam after the graphene deposition is not required. Further, the transparent conductive film layer mainly composed of the graphene is formed on the transfer sheet. Therefore, the transparent conductive film can be formed extremely easily on the desired transfer subject by the transfer. Owing to this, melting of the metal substrate and transfer to another substrate are not performed after the formation of the graphene. Owing to the above, the produced graphene can be formed on the substrate sheet and the transfer subject without a damage more than necessary.

Referring to FIG. 13, the release layer 6 may be formed on the substrate sheet 2 before the first step from FIG. 13(a) when necessary. From FIG. 13(f), after the fourth step, an adhesive layer 5 may be formed on the whole surface including the transparent conductive film layer 4. The materials and the formation methods of the adhesive layer 5 and the release layer 6 are as described before.

FIG. 14 shows another form of the manufacturing method of the transfer sheet of the first embodiment. The basic configuration of the manufacturing method of the transfer sheet is the same as that of the manufacturing method of the transfer sheet of the first embodiment, and therefore only differences will be described below.

Referring to FIG. 14, the aspect of the manufacturing method of the transfer sheet includes a step of forming the metal thin film layer 3 entirely on the substrate sheet 2, a step of forming a resist layer 9 partially on the metal thin film layer 3 to form a portion provided with the resist layer and a portion not provided with the resist layer on the metal thin film layer 3, a step of peeling and removing the metal thin film layer 3 from the portion not provided with the resist layer 9 with a solvent, and thereby forming the metal thin film layer 3 and the resist layer 9 partially on the substrate sheet 2, a step of exposing the metal thin film layer 3 on the surface by removing the resist layer 9 with a solvent, and a step of forming the transparent conductive film layer 4 mainly composed of the graphene on the metal thin film layer 3 exposed on the surface.

Referring to FIG. 14(a), in the first step, the metal thin film layer 3 is formed on the substrate sheet 2.

Referring to FIG. 14(b), in the second step, the resist layer 9 is formed partially on the metal thin film layer 3 to form the portion provided with the resist layer 9 and the portion not provided with the resist layer 9 on the metal thin film layer 3. The material of the resist layer 9 may be a resin that can form a photoresist, and may be, e.g., novolac resin or the like.

A forming method of the resist layer 9 generally employs a photoresist method. The photoresist method has a feature that the method can perform more precise patterning owing to use of light, as compared with the method of directly patterning the mask layer shown in FIG. 13 by a print method. As a specific method for forming the resist layer may be used, the resist layer can be formed on the whole surface of the substrate sheet by the print method such as screen print, gravure print, ink-jet print, or letterpress print; or by adhering the resist film provided with the resist layer to the metal thin film layer formed on the substrate sheet by heat and pressure. After forming the resist layer in the above method, the resist layer is irradiated with light to cause reactive hardening of the irradiated portion in an exposure step, and the portion which has not been irradiated with light is removed by a developing step so that the resist layer is partially formed. In the above case, as kinds of the resist layer, there is described a negative type in which exposure lowers solubility with respect to a developer and an exposed portion remains after development. However, the resist layer may be of a positive type in which exposure increases solubility with respect to a developer and an exposed portion is removed after development.

Referring to FIG. 14(c), in the third step, etching with acid, alkaline aqueous solution, or the like is performed to remove the metal thin film layer 3 from the portion not provided with the resist layer 9 so that the metal thin film layer 3 and the resist layer 9 are formed partially on the substrate sheet 2. As the acid, hydrochloric acid, sulfuric acid, nitric acid, or the like may be used, and sodium hydrate aqueous solution may be used as the alkaline aqueous solution.

Referring to FIG. 14(d), in the fourth step, the resist layer 9 is removed with a solvent to expose the metal thin film layer 3 on the surface. In the case of the positive type, the solvent for removing the resist layer may be an aqueous solution of an organic quaternary base that is strong alkali. The organic quaternary base may be tetramethyl ammonium hydroxide, tetrabutyl ammonium hydroxide, or the like.

Referring to FIG. 14(e), the processes through the first to fourth steps can perform precise patterning as compare with the case where the metal thin film layer is patterned with the mask layer.

Figure 15:
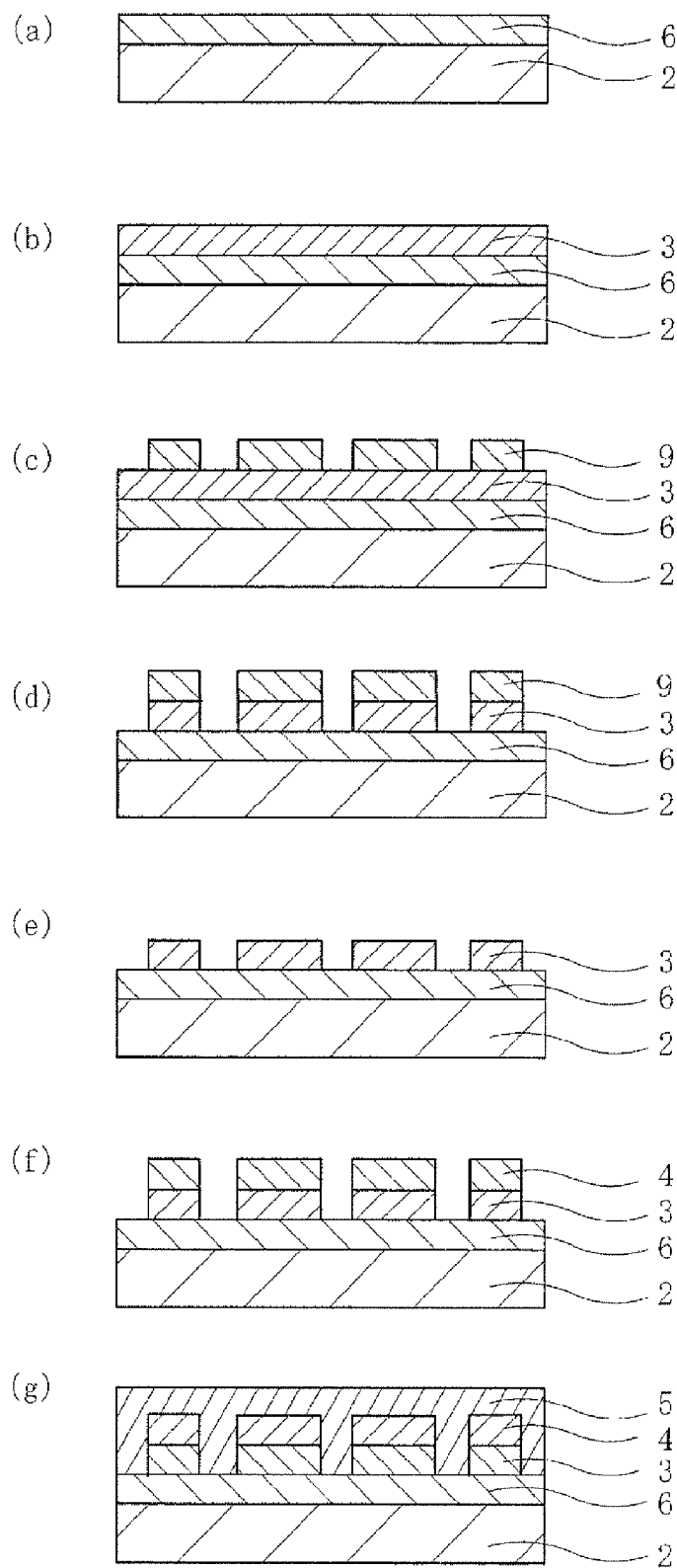
FIG. 15 is a cross section view of a transfer sheet in a transfer sheet manufacturing step of the present invention.

FIG. 15 shows a manufacturing method of the transfer sheet of the second embodiment. Referring to FIG. 15, the manufacturing method of the transfer sheet of the second embodiment forms the release layer 6 on the substrate sheet before FIG. 14(a) in FIG. 14, and forms the adhesive layer 5 on the surface including the transparent conductive film layer 4 etc. after FIG. 14(f). The material and the forming method of the adhesive layer 5 and the release layer 6 are the same as those already described.

FIG. 16 shows a manufacturing method of the transfer sheet of the third embodiment. FIG. 16 is a view showing the manufacturing method of the transfer sheet of the third embodiment. The basic configuration is the same as that of the manufacturing method of the first embodiment, and therefore only differences will be described below.

Referring to FIG. 16, the manufacturing method of the transfer sheet of the third embodiment includes a step of partially forming the mask layer 8 on the substrate sheet 2, a step of forming the routing circuit pattern layer 5 in a region on the substrate sheet 2 not provided with the mask layer 8, a step of forming the metal thin film layer 3 on the mask layer 8, the routing circuit pattern layer 5, and the substrate sheet 2, a step of peeling and removing the mask layer 8 and the metal thin film layer 3 formed on the mask layer 8 with a solvent to form the metal thin film layer 3 on the substrate sheet 2 and the routing circuit pattern layer 5, and a step of forming the transparent conductive film layer 4 mainly composed of the graphene on the metal thin film layer 3 formed on the substrate sheet 2 and the routing circuit pattern layer 5.

Referring to FIG. 16(a), in the first step of the manufacturing method of the transfer sheet of the third embodiment, the mask layer 8 is partially formed on a portion of the substrate sheet 2.

Referring to FIG. 16(b), in the second step, the routing circuit pattern layer 5 is formed in a region on the substrate sheet 2 not provided with the mask layer 8. The forming method of the routing circuit pattern layer 5 may be a print method such as screen print, gravure print, ink-jet print, or letterpress print. The material of the routing circuit pattern layer 5 may be metal such as gold, silver, copper, aluminum, nickel, or palladium; or electrically conductive ink containing powder of such metal; and also may be an electrically conductive substance containing an organic conductive material such as carbon or the like.

Referring to FIG. 16(c), in the third step, the metal thin film layer 3 is formed on the substrate sheet 2, the mask layer 8 and the routing circuit pattern layer 5.

Referring to FIG. 16(d), in the fourth step, the mask layer 8 and the metal thin film layer 3 formed on the mask layer 8 are peeled and removed with a solvent to form the metal thin film layer 3 on the substrate sheet 2 and the routing circuit pattern layer 5.

Referring to FIG. 16(e), in the fifth step, the transparent conductive film layer 4 mainly composed of the graphene is formed on the metal thin film layer 3 formed on the substrate sheet 2 and the routing circuit pattern layer 5.

The processes through the first to fifth steps can produce the transfer sheet.

When necessary, the adhesive layer 7 may be formed on the transparent conductive film layer 4 after the fifth step. The material and the forming method of the adhesive layer 7 are the same as those already described.

When necessary, the release layer 6 may be formed on the substrate sheet 2 before the first step. The material and the forming method of the release layer 6 are the same as those already described.

When necessary, the step of forming the routing circuit pattern layer 5 may be executed prior to the step of forming the mask layer 8. According to the above configuration, when the mask layer is transparent or semitransparent, and the positioning with respect to the routing circuit pattern layer 5 is difficult, the opaque routing circuit pattern layer 5 can be arranged before forming the mask layer 8 to facilitate the positioning thereof.

When necessary, the step of forming the routing circuit pattern layer 5 may be executed between the step of forming the metal thin film layer 3 and the step of peeling and removing the mask layer 8. In this case, the routing circuit pattern layer 5 is formed on the metal thin film layer 3 formed on the substrate sheet 2 and particularly on the metal thin film layer 3 under which the mask layer is not formed. According to this configuration, the routing circuit pattern layer 5 can be exposed only by removing the metal thin film layer 3 so that the electrical connection to an external circuit can be easily performed.

When necessary, the step of forming the routing circuit pattern layer 5 may be performed between the step of peeling and removing the mask layer 8 and the step of forming the transparent conductive film layer 4. In this case, the routing circuit pattern layer 5 is formed on a portion of the metal thin film layer 3 which is not peeled and removed from the substrate sheet 2. According to this configuration, the influence of the solvent used in the step of peeling and removing the mask layer 8 does not directly affect the routing circuit pattern layer 5 so that the routing circuit pattern layer 5 can be formed without taking disadvantages such as corrosion into consideration.

When necessary, the step of forming the routing circuit pattern layer 5 may be executed after the step of forming the transparent conductive film layer 4. In this case, the routing circuit pattern layer 5 is formed on the transparent conductive film layer 4. According to this structure, the transparent conductive film layer is formed on the transferred routing circuit pattern layer so that the transparent conductive film layer protects the routing circuit pattern layer.

FIG. 17 shows a second embodiment of the manufacturing method of the transfer sheet of the third embodiment. The basic configuration of the manufacturing method of the transfer sheet is the same as that of the manufacturing method of the transfer sheet according to the first embodiment, and therefore only differences will be described below.

Referring to FIG. 17, the second embodiment includes a step of forming partially the routing circuit pattern layer 5 on the substrate sheet 2, a step of forming the metal thin film layer 3 on the routing circuit pattern layer 5 and the substrate sheet 2, a step of forming partially the resist layer 9 on the metal thin film layer 3 formed on the substrate sheet 2, a step of peeling and removing the metal thin film layer 3 from a portion not provided with the resist layer 9 with a solvent to form partially the metal thin film layer and the resist layer 9 on the substrate sheet 2, a step of removing the resist layer 9 with a solvent to expose the metal thin film layer 3 on the surface, and a step of forming the transparent conductive film layer 4 mainly composed of the graphene on the metal thin film layer 3 having the exposed surface.

Referring to FIG. 17(a), the first step forms partially the routing circuit pattern layer 5 on the substrate sheet 2.

Referring to FIG. 17(b), the second step forms the metal thin film layer 3 on the routing circuit pattern layer 5 and the substrate sheet 2.

Referring to FIG. 17(c), the third step forms the resist layer 9 partially on the metal thin film layer 3 formed on the substrate sheet 2.

However, when fine patterning is to be performed, it is preferable to use, as the resist layer, resin that can provide photo-resist and, for example, to use novolac resin, tetramethyl ammonium hydroxide, or the like. In this case, after the resist layer is formed in the above method, the resist layer is irradiated with light to cause reactive hardening in the irradiated portion in the exposure step. Then, the resist layer is partially formed through the developing step of removing a portion not irradiated with the light.

Referring to FIG. 17(*d*), the fourth step peels and removes the metal thin film layer 3 by a solvent from a portion not provided with the resist layer 9 to form partially the metal thin film layer 3 and the resist layer 9 on the substrate sheet 2

Referring to FIG. 17(*e*), the fifth step removes the resist layer 9 with a solvent to expose the metal thin film layer 3 on the surface thereof. The organic quaternary base may be used as the solvent for removing the resist layer 9. The organic quaternary base may be tetramethyl ammonium hydroxide, tetrabutyl ammonium hydroxide, or the like.

The processes through the first to fifth steps can perform more precise patterning than the case of patterning the metal thin film layer 3 with the mask layer 8.

When necessary, the adhesive layer 7 may be formed after the fifth step. The material and forming method of the adhesive layer 7 are the same as those already described.

When necessary, the release layer 6 may be formed on the substrate sheet 2 before the first step. The material and the forming method of the release layer 6 are the same as those already described.

When necessary, the step of forming the routing circuit pattern layer 5 may be performed between the step of forming the metal thin film layer 3 and the step of forming the resist layer 9. In this case, the routing circuit pattern layer 5 is formed on a portion of the metal thin film layer 3 formed on the substrate sheet 2. The resist layer 9 is formed partially on the routing circuit pattern layer 5 and the metal thin film layer 3. According to the above configuration, when the resist layer is transparent or semitransparent, and the positioning with respect to the routing circuit pattern layer is difficult, the opaque routing circuit pattern layer can be arranged before the resist layer is formed, to facilitate the positioning thereof.

When necessary, the step of forming the routing circuit pattern layer 5 may be performed between the step of exposing the metal thin film layer 3 on the surface by removing the resist layer 9 and the step of forming the transparent conductive film layer 4. In this case, the routing circuit pattern layer is formed on a portion of the metal thin film layer formed partially on the substrate sheet. In this configuration, the routing circuit pattern layer can be exposed only by removing the metal thin film layer so that the electrical connection to an external circuit can be easily performed.

When necessary, the step of forming the routing circuit pattern layer 5 may be performed after the step of forming the transparent conductive film layer 4. In this case, the routing circuit pattern layer 5 is formed on the transparent conductive film layer 4. In this configuration, the transparent conductive film layer 4 is formed on the transferred routing circuit pattern layer so that the transparent conductive film layer protects the routing circuit pattern layer.

Next, a transparent conductor produced using the transfer sheet will be described below.

Figure 18:
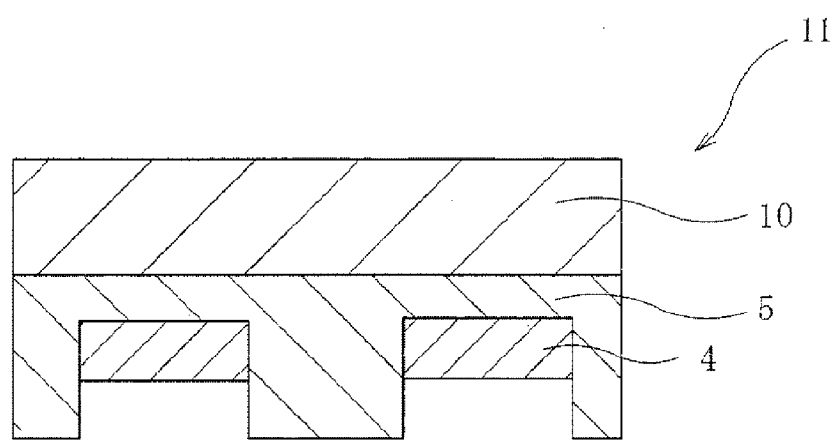
FIG. 18 is a cross section view of a transparent conductor of the present invention.

FIG. 18 is a view showing a transparent conductor 11 manufactured using the transfer sheet according to the first or second embodiment. Referring to FIG. 18, the transparent conductor 11 of the present invention includes a transfer subject 10 as well as the routing circuit pattern layer 5 formed on the transfer subject 10, and the transparent conductive film layer 4.

The transfer subject 10 is not particularly restricted as long as the transfer subject 10 is transparent, is not electrically conductive, and has a certain hardness. The transfer subject 10 may have a film-like form, and also may be a three-dimensional molded product. The material of the transfer subject 10 is, e.g., glass, polyethylene terephthalate (PET), polyethylene, polypropylene, polystyrene, polyester, polycarbonate (PC), polyvinyl chloride, acrylic, or the like. The transfer subject 10 of a film-like form preferably has a thickness of 30 µm to 200 µm.

Figure 19:
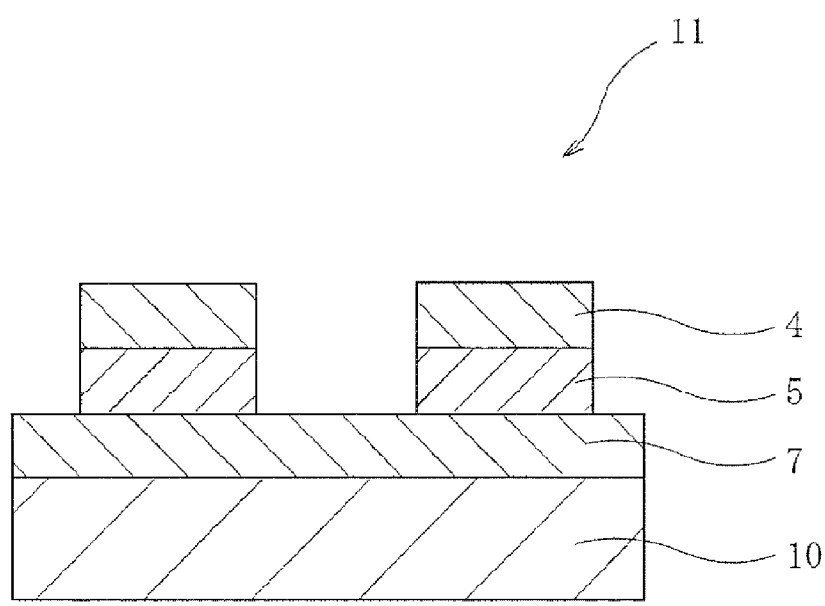
FIG. 19 is a cross section view of a transparent conductor of the present invention.

FIG. 19 is a view showing a transparent conductor 11 manufactured using the transfer sheet according to any one of the third to seventh embodiments of the present invention. The basic configuration of the transparent conductor of the embodiment is the same as the transparent conductor described above, and therefore only differences will be described below. Referring to FIG. 19, the transparent conductor 11 of the present invention includes a transfer subject 10 and also includes an adhesive layer 7 formed on the transfer subject 10, a routing circuit pattern layer 5, and a transparent conductive film layer 4.

Finally, a manufacturing method of the above transparent conductor will be described.

The transparent conductor of the present invention is transparent and electrically conductive. The transparent conductor is obtained by the transfer of the transfer sheet of the present invention to the transfer subject and removal of the metal thin film layer. The manufacturing method of the transparent conductor will now be discussed below in detail.

First, the transfer will be described. When the transfer subject is flexible and has a two-dimensional form, a roll transfer method, an up-down transfer method, or the like is employed. When the transfer subject has a three-dimensional form, a pad transfer method, a vacuum transfer method, a simultaneous molding and transferring method, or the like may be used in addition to the roll-transfer method and the up-down transfer method. The roll transfer method uses a transferring machine provided with a columnar heat roll made of silicon rubber, and the roll presses the transfer sheet in contact with the transfer subject, and the releasable substrate sheet is removed. In the up-down transfer method, the transfer sheet is pressed against the transfer subject by a heated flat rubber, and the releasable substrate sheet is removed. The pad transfer method uses a pad of a form corresponding to a form of the transfer subject. In the vacuum transfer method, a die having a form corresponding to that of the transfer subject has fine holes, and the transfer sheet is located along the form of the die and is kept into tight contact with the die in a depressurized and heated state. The transfer subject is brought into contact with the transfer sheet, and the releasable substrate sheet is removed. The transfer is performed under the conditions of temperature of 70° C. to 280° C. and pressure of 40 kg/m$^2$ to 180 kg/m$^2$. The selection of these transfer methods depends on the form of the transfer subject in order to apply the uniform heat and uniform pressure during the transfer. The up-down transfer is effective for the transfer subject of a substantially flat form, and the roll transfer is effective for the transfer subject having a flat form or a simple sectional form. The pad transfer and the vacuum transfer are effective for the complicated form.

Figure 20:
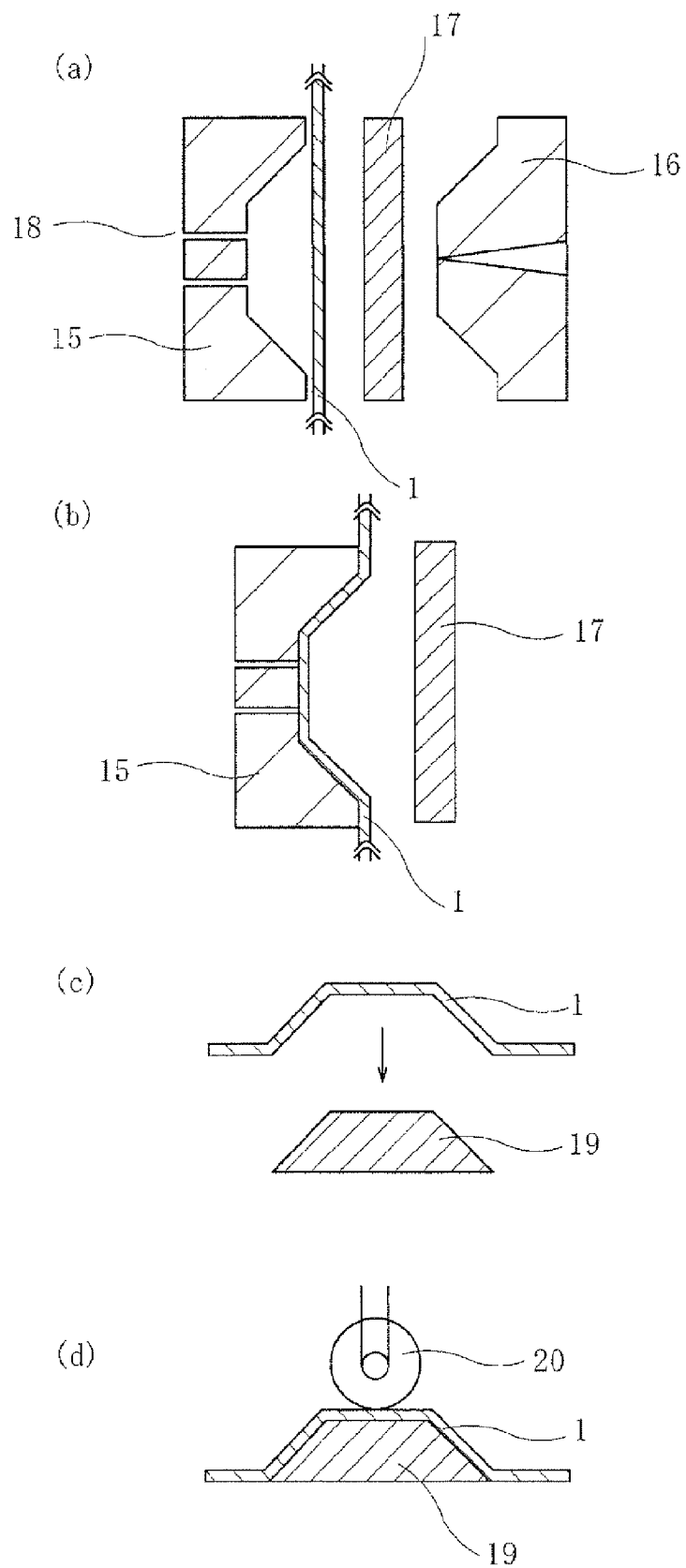
FIG. 20 is a cross section view of a transparent conductor of the present invention in a transparent conductor manufacturing step.

For the transfer to the three-dimensional form, the vacuum molding method is effective. The vacuum molding method will be described below. Referring to FIG. 20(*a*), the transfer sheet 1 is arranged on a movable die 15-side of injection molding dies with its adhesion surface opposed to a fixed die 16-side. A heater plate 17 arranged between the movable and fixed dies 15 and 16 applies heat to the transfer sheet to soften the transfer sheet, and simultaneously an air is sucked and discharged through the plurality of fine holes (vacuum holes 18) in the movable die to reduce a pressure in a space formed between the movable die and the transfer sheet. Referring to 20(b), the space disappears and the softened transfer sheet takes a three-dimensional form along the movable die. The form of the movable die is complementary to one of the desire shapes of the transparent conductor. The transfer sheet of the three-dimensional form thus obtained is transferred to the transfer subject by any one of the foregoing transfer methods. Referring to FIGS. 20(c) and 20(d), for example, the transfer sheet of the three-dimensional form is fitted to the transfer subject, and is transferred by the roll transfer machine.

Figure 21:
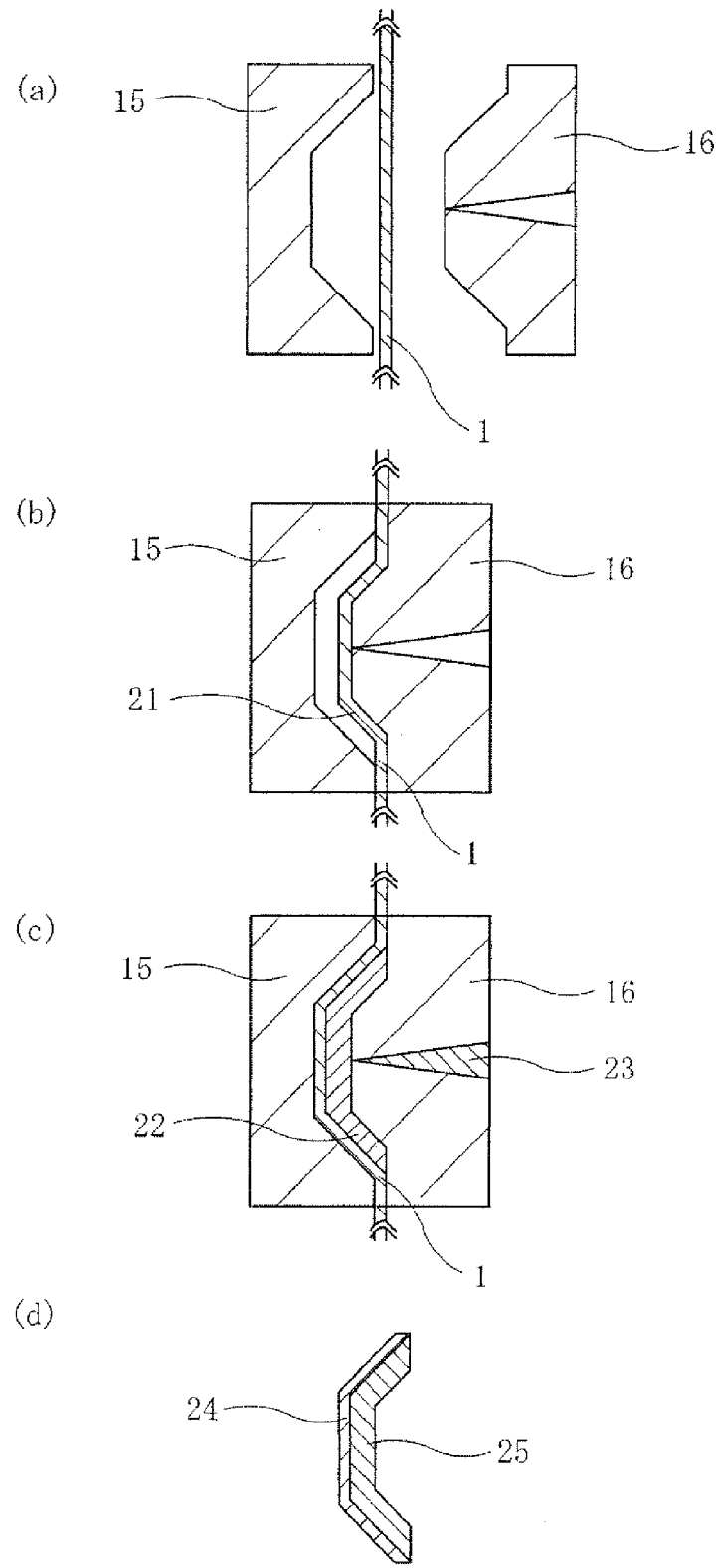
FIG. 21 is a cross section view of a transparent conductor of the present invention in a transparent conductor manufacturing step.

Conversely, the transfer may be performed by the molding-simultaneous transfer method which performs the molding simultaneously with the transfer and achieves good productivity. In the molding-simultaneous transfer method, a transfer sheet is pinched between closed dies, and injection molding of melted molding resin is performed. Simultaneously, a transparent conductive layer and the others on the transfer sheet are adhered to a resin-molded product, and functional layer (the transparent conductive layer or the like) is transferred so that the molded resin article including the functional layer at its surface is obtained. Referring to FIG. 21(a), the transfer sheet 1 (having the routing circuit also in the transparent conductive portion 8) of the present invention is arranged between the dies (movable and fixed dies 15 and 16) for the injection molding and is located on the side of the movable die 15 with the adhesive layer 5 of the transfer sheet 1 opposed to the fixed die 16. Referring to FIG. 21(b), the dies are closed. A space (molding space 21) formed by closing the movable and fixed dies 15 and 16 has a width, height, and depth corresponding to the desired width, height, and depth of the transparent conductor, respectively. Referring to FIG. 21(c), in the die-closed state, melted molding resin 22 is supplied into the molding space 21 through a gate 23 and is solidified so that the transfer sheet 1 is integrally adhered to the molded resin 22. The dies are opened, and the substrate sheet 7 of the releasable transfer sheet 1 is removed so that a layer 24 including the transparent conductive film layer 4 is formed on a surface of a molded resin article (transparent conductor) 25.

The mold resin is not particularly restricted as long as the mold resin can take a melted state at a high temperature. Polyethylene, acrylic resin, polystyrenic resin, polyacrylonitrile styrenic resin, polyester, polycarbonate, or the like may be employed.

In the case of transfer to a more complicated form, the extension of the transfer sheet cannot follow the form of the transfer subject, resulting in problems of distortion, breakage, or the like of the transparent conductive film layer. For dealing with this problem, such a method is employed that the transfer sheet is molded in advance by a vacuum molding method and is transferred to a surface of a three-dimensional form by a molding-simultaneous transfer method. In a state where the transfer sheet of the three-dimensional form is obtained in FIG. 20(b), the heater plate 17 is removed, the dies are closed, the molding resin 22 is injected into the molding space 21 to become integral with the transfer sheet, the dies are opened, and the releasable substrate sheet is removed so that the transparent conductor is obtained.

The etching liquid is used in the etching for removing the metal thin film layer. The metal thin film layer serves as a catalyst in production of the graphene that is a main ingredient of the transparent conductive film layer, and is specifically, copper, nickel, ruthenium, iron, cobalt, iridium, platinum, or the like. A pH and a composition of the etching liquid basically depend on a relation with metal used in the metal thin film layer, and a potential-pH diagram (metal-aqueous) can be referred to for the pH and the composition. The etching liquid is selected to attain the pH and the potential within a corrosion region where the metal corrodes and the metal ions or the ions of the metal compound become stable, other than both of an a metamorphosis region where the metal does not cause a chemical reaction and stably exists, and a passive state region where a chemical reaction initially occurs under a specific potential-pH condition and chemically inert chemical species are produced under the this condition. For example, a corrosion region of nickel is specified by ($-0.4$ V$\leq$potential$\leq$+0.4 V) and (pH$\leq$6), or by (+0.4 V<potential$\leq$+1.5 V) and (pH$\leq$0). A corrosion region of copper is specified by (potential$\geq$+0.2V) and (pH$\leq$7, or pH$\geq$11) Adjustment is performed, e.g., by combination with oxidizer such as hydrogen peroxide, potassium permanganate, or ammonium persulfide, or a combination of such oxidizer and acid such as sulfuric acid. Further, it is preferable not to generate hydrogen. The hydrogen is not generated when a potential is larger than 0.00 V that is a standard electrode potential E (vs SHE) of the hydrogen. In connection with this, the copper has E of +0.34 V larger than E of 0.00 V of the hydrogen, and the hydrogen is not generated in the corrosion region. Additionally, it is more preferable that oxygen does not exist. The existence of oxygen increases the pH value due to generation of OH— by a reaction with water, and it may not belong to an appropriate range. Further, conditions such as an etching liquid dipping time and a dipping temperature are adjusted depending on the thickness and area of the metal thin film layer.

Figure 22:
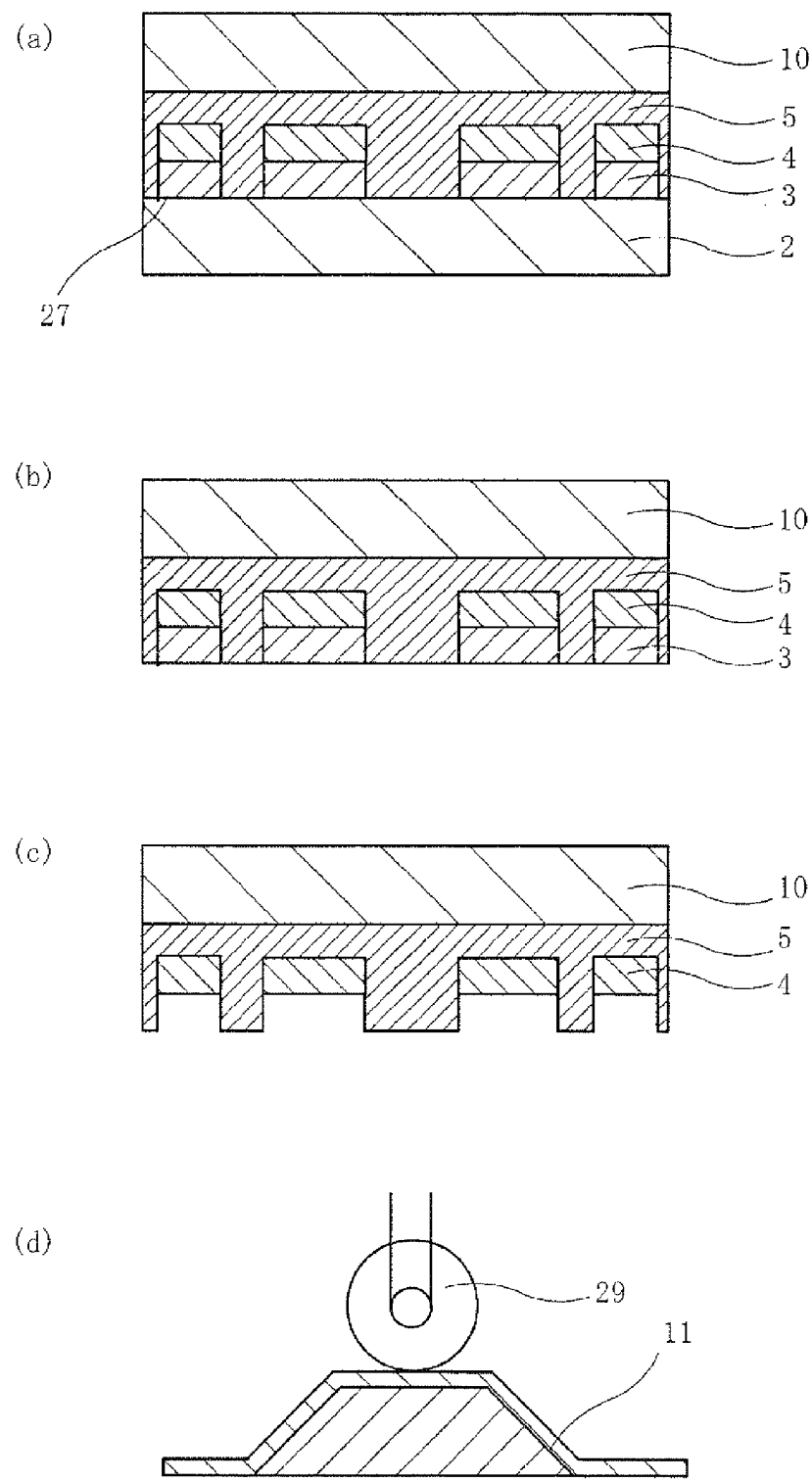
FIG. 22 is a cross section view of a transparent conductor of the present invention in a transparent conductor manufacturing step.

The transparent conductor having the two transparent conductive layers is manufactured by using a transfer sheet, having a routing circuit at only a periphery of a transparent conductive film layer 4. On the other hand, referring to FIG. 22(a), pressing and heating are performed by a roll transfer or the like to adhere integrally the transfer sheet having the routing circuit at the periphery of the transparent conductive film layer to a flexible transparent substrate (transfer subject 10). Referring to FIG. 22(b), a substrate sheet 2 is then removed, and the metal thin film layer 3 is removed by dipping the transfer sheet-attached product into an etching liquid.

The metal thin film layer is removed by the wet etching. The wet etching method specifically includes a spray method of atomizing an etching liquid, a dipping method of dipping a work into an etching liquid and pulling up it, and the like. For example, a transfer subject to which a layer including a transparent conductive film layer at its surface is transferred is dipped into the etching liquid so that the metal thin film layer can be removed. Thereby, a transparent conductor having one transparent conductive layer is obtained.

Referring to FIG. 22(c), a two-dimensional transparent conductor 11 having flexibility is thereby obtained. Finally, the foregoing roll transfer method, up-down transfer method, pad transfer method, vacuum transfer method, or the like is executed so that the two-dimensional transparent conductor is adhered so as to be opposed to a transparent conductive layer of a three-dimensional transparent conductor. FIG. 22(d) illustrates the roll transfer method.

By using a transparent and electrically insulative adhesive for adhesion of the three- and two-dimensional transparent conductors, these can be used in a capacitive touch panel. The use of the adhesive layer provides an effect of holding an interval between layers in contact with the adhesive layer as well as effects attained by not providing an air layer, i.e., an effect of preventing a defect in outer appearance due to a Newton ring and an effect as a spacer that adjusts a distance between transparent electrodes. On the other hand, the use of a transparent and pressure conductive adhesive allows use in a touch panel of a resistive film type. When a pressure conductive layer is arranged between the transparent electrodes by a transparent and pressure conductive adhesive, the foregoing effects of electrical insulation, the interlayer adhesion, and prevention of the outer appearance defect can be achieved by the spacer.

When the adhesive is the pressure conductive adhesive, this improves the reliability of the touch panel functions. The pressure conductive layer in the present invention is formed of a pressure conductive adhesive, and has a plurality of transparent and electrically conductive substrates dispersed in an electrically insulative transparent resin. When the pressure conductive layer is not subjected to an external pressure, the pressure conductive layer is not conductive and is insulative. When the pressure conductive layer receives an external pressure, changes in form of the pressure conductive layer reduces a relative distance between the plurality of conductive substances so that the conductive substances make contact or generate a tunnel current, and thereby a resistance value decreases to flow an electric current in a pressure direction. In the touch panel, the pushing pressure direction matches the direction between the transparent electrodes. Therefore, the resistance value between them lowers to flow an electric current and the position detection can be performed. Since no pressure is applied in a direction of a transparent electrode plane, the insulation is kept in this direction, and no problem occurs in the position detection. The pressure conductive layer is made of resin and electrically conductive substances. The resin is not particularly restricted as long as the resin is transparent and insulative. For example, the resin may be acrylic or vinyl. The conductive substances are not particularly restricted as long as the conductive substances are transparent and conductive, and have low visibility. More preferably, a size thereof is shorter than a wavelength thereof in the visible light range. A material thereof is metal such as gold, silver, copper, or aluminum; alloy thereof; or metal oxide such as ITO or zinc oxide ($ZnO_2$).

Working Examples of the Transfer Sheet of the Second Embodiment

Working Example 1

On a substrate sheet formed of a polyimide film having a surface of an arithmetic average roughness (Ra) of 0.4 nm and a thickness of 30 μm, a mask layer was partially formed by an offset print method using polyvinyl alcohol resin. After drying the above mask layer, a metal thin film layer (Cu layer of 100 nm in thickness) was formed on the substrate sheet and the mask layer by a sputtering method. Thereafter, the mask layer and the metal thin film layer formed on the mask layer were removed by water washing to obtain the partially formed metal thin film layer. The sheet thus obtained was arranged in a chamber, and a material gas made of methane and argon (a partial pressure ratio of methane and argon is 1:1) was kept at a constant pressure of 360 Pa in the chamber by adjusting the inflow velocity of the material gas into the chamber and the exhaust velocity of a pump. In this state, microwave plasma CVD was performed under conditions of 380° C. and 40 seconds to form a transparent conductive film layer mainly composed of graphene. Finally, an adhesive layer was formed on the whole surface of the transparent conductive film layer to give a transfer sheet.

Working Example 2

A transfer sheet was obtained by the same operations as those of Working Example 1 except that a substrate sheet having a surface of an arithmetic average roughness (Ra) of 17 nm was used.

Working Example 3

A transfer sheet was obtained by the same operations as those of Working Example 1 except that a metal thin film layer had a thickness of 0.02 μm.

Working Example 4

A transfer sheet was obtained by the same operations as those of Working Example 1 except that a metal thin film layer had a thickness of 0.8 μm.

Working Example 5

A transfer sheet was obtained by the same operations as those of Working Example 1 except that a release layer having a surface of arithmetic average roughness (Ra) of 0.2 nm and made of fluororesin was formed on a substrate sheet made of a polyimide film and having a thickness of 30 μm before a mask layer was formed on the substrate sheet.

Comparative Example 1

A transfer sheet was obtained by the same operations as those of Working Example 1 except that a substrate sheet having a surface of an arithmetic average roughness (Ra) of 0.08 nm was used.

Comparative Example 2

A transfer sheet was obtained by the same operations as those of Working Example 1 except that a substrate sheet having a surface of an arithmetic average roughness (Ra) of 22 nm was used.

Comparative Example 3

A transfer sheet was obtained by the same operations as those of Working Example 1 except that the thickness of a metal thin film layer was 0.007 μm.

Comparative Example 4

A transfer sheet was obtained by the same operations as those of Working Example 1 except that the arithmetic average roughness of the surface was 20 nm and the thickness of a metal thin film layer was 1.3 μm.

Comparative Example 5

A transfer sheet was obtained by the same operations as those of Working Example 5 except that the arithmetic average roughness (Ra) of the surface of a release layer was 0.00 nm.

The transfer sheets obtained in Working Examples 1 to 5 and Comparative Examples 1 to 5 were adhered to polyethylene terephthalate, and the substrate sheets, or the substrate sheets and the release layers were each peeled off from the transfer subjects. Amounts of residual materials adhering to the substrate sheets or the release layers were compared and studied. Then, only the metal thin film layers formed on the surfaces of the transfer subjects were removed by an etching liquid to obtain transparent conductors 1 to 5 each formed of the transfer subject and the transparent conductive film layer. The same operations were effected on the transfer sheets obtained in Comparative Examples 1 to 5 to obtain transparent conductors 6 to 10, respectively.

Measurement of Surface Roughness of the Substrate Sheet or the Release Layer

The surface roughness of each of the substrate sheets and the release layers was measured by a method according to (JIS) B0601-1994 using F3500D manufactured by Kosaka Laboratory Ltd.

Evaluation of the Transfer Sheet

After pasting the transfer sheet obtained in each of Working Examples 1 to 5 to the transfer subject, i.e., polyethylene terephthalate, the substrate sheet, or the substrate sheet and the release layer were peeled off from the transfer subject, and the amount of a residual material adhering to the substrate sheet or the release layer was measured. As a result, the residual materials were hardly visible to the naked eye except for the cases where the transfer sheet of Comparative Example 1 or 5 was used. In the cases of using the transfer sheet of Comparative Example 1 or 5, existence of the residual materials was recognized in contrast to the cases of using the other transfer sheets.

Evaluation of the Transparent Conductors

The degree of variation in conductivity was evaluated in the transparent conductors 1 to 10. The evaluation manner was such that the resistance between any terminals of the same form was measured ten times in each of the patterned transparent conductive film layers, and the average and standard deviation of the obtained resistance values were calculated. As a result, the average values of the resistances in the transparent conductors 1 to 5 were smaller than those of the transparent conductors 6 to 10. The standard deviations of the resistance values in the transparent conductors 1 to 5 were smaller than those of the transparent conductors 6 to 10. This showed that the transparent conductors 1 to 5 exhibit smaller and stabler resistance values. From the above, it was understood that the transparent conductors 1 to 5 obtained by using the transfer sheets of Working Examples 1 to 5 have good conductivity.

Working Examples of the Transfer Sheet of the Third Embodiment

Working Example 1

Using polyvinyl alcohol resin, a mask layer was formed partially by an offset print method on a substrate sheet (product name: Mictron, corporation name: Toray Industries, Inc.) made of a polyaramid film having a thickness of 25 µm and an arithmetic average roughness (Ra) of its surface of 7 nm. After the mask layer was dried, a metal thin film layer (Cu layer of 100 nm in thickness) was formed on the substrate sheet and the mask layer by a sputtering method. Thereafter, the mask layer and the metal thin film layer formed on the mask layer were removed by water washing to obtain the partially formed metal thin film layer. The sheet thus obtained was arranged in a chamber, and a material gas made of methane and argon (a partial pressure ratio of methane and argon is 1:1) was kept at a constant pressure of 360 Pa in the chamber by adjusting the inflow velocity of the material gas into the chamber and the exhaust velocity of a pump. In this state, microwave plasma CVD was performed under conditions of 380° C. and 40 seconds to form a transparent conductive film layer mainly composed of graphene. A routing circuit pattern layer was formed on the transparent conductive film layer using Silver Paste SAP-15 (product name) of Sanwa Chemical Industrial Co., Ltd. (corporation name). Finally, an adhesive layer was formed on the whole surface to obtain a transfer sheet.

Working Example 2

A transfer sheet was obtained by the same operations as those of Working Example 1 except that a substrate sheet having a surface of an arithmetic average roughness (Ra) of 17 nm was used.

Working Example 3

A transfer sheet was obtained by the same operations as those of Working Example 1 except that the thickness of a metal thin film layer was 0.01 µm.

Working Example 4

A transfer sheet was obtained by the same operations as those of Working Example 1 except that the thickness of a metal thin film layer was 0.8 µm.

Working Example 5

A transfer sheet was obtained by the same operations as those of Working Example 1 except that a release layer having a surface of 0.2 nm in arithmetic average roughness (Ra) was formed using fluororesin on a substrate sheet (product name: Mictron, corporation name: Toray Industries, Inc.) made of a polyaramid film having a thickness of 25 µm before a mask layer was formed on the substrate sheet.

Comparative Example 1

A transfer sheet was obtained by the same operations as those of Working Example 5 except that a release layer having a surface of an arithmetic average roughness (Ra) of 20 nm was formed and a metal thin film layer had a thickness of 0.9 µm.

Comparative Example 2

A transfer sheet was obtained by the same operations as those of Working Example 1 except that a substrate sheet having a surface of 22 nm in arithmetic average roughness (Ra) was used.

Comparative Example 3

A transfer sheet was obtained by the same operations as those of Working Example 1 except that the thickness of a metal thin film layer was 0.007 µm.

Comparative Example 4

A transfer sheet was obtained by the same operations as those of Working Example 1 except that the arithmetic average roughness of its surface was 20 nm and the thickness of a metal thin film layer was 0.9 µm.

Comparative Example 5

A transfer sheet was obtained by the same operations as those of Working Example 5 except that the thickness of a metal thin film layer was 1.3 µm.

Each of the transfer sheets obtained in Working Examples 1 to 5 and Working Comparative Examples 1 to 5 was then pasted to the transfer subject, i.e., a polyethylene terephthalate film of 200 μm, and a portion of the transfer sheet, i.e., the substrate sheet, or the substrate sheet and the release layer were peeled off from the transfer subject. Then, only the metal thin film layer formed on the surface of the transfer subject was removed by an etching liquid to obtain a transparent conductor formed of the transfer subject and the transparent conductive film layer.

Measurement of the Surface Roughness of the Substrate Sheet or the Release Layer The surface roughness of the substrate sheet or the release layer was measured by a method according to (JIS) B0601-1994 using F3500D manufactured by Kosaka Laboratory Ltd. The results are shown in Table 1.

Evaluation of the Releasability of the Transfer Sheet

As to the releasability of each of the transfer sheets obtained in Working Examples 1 to 5 and Comparative Examples 1 to 5, evaluation was performed on the transparent conductors as follows. In the evaluation method, each of the transfer sheets of Working Examples 1 to 5 and Examples 1 to 5 is pasted to a polyethylene terephthalate film of 200 μm, then the substrate sheet, or the substrate sheet and the release layer were peeled off from the polyethylene terephthalate film, and the rate of the metal thin film layer remaining on the substrate sheet or the release layer was measured. The results are shown in Table 1.

◯: The metal thin film layer was adhered to the substrate sheet or the release layer at a rate less than 0.02 cm² per 1 cm².

Δ: The metal thin film layer was adhered to the substrate sheet or the release layer at a rate of 0.02 cm² or more and less than 0.1 cm² per 1 cm².

Evaluation of the Stability of the Transparent Conductor

The degree of variation in conductivity of each of the transparent conductors obtained by using the transfer sheets of Working Examples 1 to 5 and Comparative Examples 1 to 5, respectively, was evaluated as follows. The evaluation manner was such that the resistance between any terminals of the same form was measured ten times in each of the patterned transparent conductive film layers, and the standard deviation of the obtained resistance values was calculated and evaluated as follows. The results are shown in Table 1.

◯: within average±1σ (standard deviation)

Δ: within average±2σ (standard deviation)

x: exceeding average±2σ (standard deviation)

Evaluation of the Conductivity of the Transparent Conductor

The conductivity of each of the transparent conductors obtained by using the transfer sheets of Working Examples 1 to 5 and Comparative Examples 1 to 5, respectively, was evaluated as follows. The evaluation manner was such that the surface resistance value of a film surface was measured by a surface resistance meter "Loresta IP" manufactured by Mitsubishi Petrochemical Co., Ltd. The results are shown in Table 1.

◯: surface resistance value is less than 200Ω/□

Δ: surface resistance value is between 200Ω/□ and 500Ω/□ x: surface resistance value is more than 500Ω/□

Evaluation of the Transparency of the Transparent Conductor

The transparency of each of the transparent conductors obtained by using the transfer sheets of Working Examples 1 to 5 and Comparative Examples 1 to 5, respectively, was evaluated as follows. The evaluation was made according to JIS-K-7361, and the total light transmittance was evaluated by Haze Meter HR-100 (Murakami Color Research Laboratory Co., Ltd.). The results are shown in Table 1.

◯: total light transmittance was 90% or more

Δ: total light transmittance was 80% or more and less than 90%

TABLE 1

| | Surface roughness (Ra/nm) of substrate sheet or release layer | Thickness (μm) of metal thin film layer | Releasability evaluation of substrate sheet or release layer | Transparent conductor | | |
|---|---|---|---|---|---|---|
| | | | | Stability evaluation | Conductivity evaluation | Transparency evaluation |
| Working Example 1 | 7 | 0.1 | ◯ | ◯ | ◯ | ◯ |
| Working Example 2 | 17 | 0.1 | ◯ | ◯ | ◯ | ◯ |
| Working Example 3 | 7 | 0.01 | ◯ | ◯ | ◯ | ◯ |
| Working Example 4 | 7 | 0.8 | ◯ | ◯ | ◯ | ◯ |
| Working Example 5 | 0.2 | 0.1 | ◯ | ◯ | ◯ | ◯ |
| Comparative Example 1 | 20 | 0.9 | ◯ | Δ | Δ | Δ |
| Comparative Example 2 | 22 | 0.1 | Δ | X | Δ | Δ |
| Comparative Example 3 | 7 | 0.007 | Δ | ◯ | Δ | Δ |
| Comparative Example 4 | 20 | 0.9 | ◯ | Δ | Δ | Δ |
| Comparative Example 5 | 0.2 | 1.3 | ◯ | X | X | Δ |

Working Example of Manufacturing of a Touch Panel

Working Example 1

A release layer made of fluororesin was formed on a substrate sheet made of a polyimide film of 30 μm in thickness (after formation, the release layer has a surface of an arithmetic average roughness (Ra) of 0.1 nm), and a solvent-soluble mask layer made of polyvinyl alcohol resin was formed on the release layer by an offset print method. After the mask layer was dried, a metal thin film layer (Cu layer of 300 angstroms in thickness) was formed by a sputtering method on the whole surface. Thereafter, the solvent-soluble mask layer and the metal thin film layer formed on the mask layer were removed by water washing to form a patterned metal thin film layer. Then, the sheet was arranged in a chamber filled with a material gas made of methane and argon (a partial pressure ratio of methane and argon is 1:1), and microwave plasma CVD was performed under conditions of 380° C. and 40 seconds to form a transparent conductive film layer mainly composed of graphene. The transparent conductive film layer was patterned, and an adhesive layer was formed on the whole surface thereof so that a transfer sheet was obtained. The transfer sheet thus obtained was transferred to a PET film, and was dipped in an etching liquid primarily containing hydrogen peroxide and sulfuric acid to produce a two-dimensional transparent conductor. By the molding-simultaneous transfer method of another transfer sheet obtained in Working Example 1, the layers including the transparent conductive layer were transferred to a bowl-like outer surface, using polystyrene resin, and were dipped in an etching liquid primarily containing hydrogen peroxide and sulfuric acid to remove the metal thin film layer. The two-dimensional transparent conductor thus obtained and having the transparent conductive layers opposed to each other was adhered to a three-dimensional transparent conductor by an adhesive serving as a pressure sensitive layer.

A touch panel was produced using the transparent conductor thus obtained. Good operation functions were obtained.

REFERENCE SIGNS LISTS 1 transfer sheet
2 substrate sheet
3 metal thin film layer
4 transparent conductive film layer
5 routing circuit pattern layer
6 release layer
7 adhesive layer
8 mask layer
9 resist layer
10 transfer subject
11 transparent conductor

The invention claimed is:

1. A transparent conductor manufactured by using a transfer sheet comprising:
    a substrate having a surface of an arithmetic average roughness (Ra) of 0.1 nm or more and 20 nm or less;
    a metal thin film layer formed partially or entirely on the substrate sheet to reflect the arithmetic average roughness of the surface of the substrate sheet; and
    a transparent conductive film layer formed on the metal thin film layer and mainly composed of graphene,
    the transparent conductor having, as the transparent conductive film layer, one transparent conductive portion mainly composed of graphene, comprising:
    a flexible transparent substrate of a two-dimensional form;
    a resin layer formed on one of surfaces of the transparent substrate; and
    a transparent conductive portion formed of the transparent conductive film layer that is mainly composed of graphene and formed on the resin layer as a result of removal of the metal film layer, and having flexibility.

2. A transparent conductor having two transparent conductive portions mainly composed of graphene, and manufactured by using first and second transfer sheets comprising:
    each of first and second substrate sheets having a surface of an arithmetic average roughness (Ra) of 0.1 nm or more and 20 nm or less;
    first and second metal thin film layers formed partially or entirely on the respective substrate sheets to reflect the arithmetic average roughness of the surface of the substrate sheets; and
    first and second transparent conductive film layers formed on the metal thin film layers and mainly composed of graphene,
    the transparent conductor comprising:
    a flexible first transparent substrate of a two-dimensional form;
    a first resin layer formed on one of surfaces of the first transparent substrate;
    a first transparent conductive portion, as the first transparent conductive film layer, formed of the first transparent conductive film layer formed on the first resin layer as a result of removal of the first metal thin film layer and mainly composed of graphene;
    a flexible second transparent substrate of a two-dimensional form;
    a second resin layer formed on one of surfaces of the second transparent substrate; and
    a second transparent conductive portion, as the second transparent conductive film layer, formed of the second transparent conductive film layer formed on the second resin layer as a result of removal of the second thin film layer and mainly composed of graphene, wherein
    the first and second transparent conductive portions are opposed to each other to keep electrical isolation, and the transparent conductor is flexible and has a two-dimensional form.

3. A transparent conductor having one transparent conductive portion mainly composed of graphene, and manufactured by using a transfer sheet comprising:
    a substrate having a surface of an arithmetic average roughness (Ra) of 0.1 nm or more and 20 nm or less;
    a metal thin film layer formed partially or entirely on the substrate sheet to reflect the arithmetic average roughness of the surface of the substrate sheet; and
    a transparent conductive film layer formed on the metal thin film layer and mainly composed of graphene,
    the transparent conductor comprising:
    a transparent substrate of a three-dimensional form;
    a resin layer formed on one of surfaces of the transparent substrate; and;
    a transparent conductive portion, as the transparent conductive film layer, formed of the transparent conductive film layer mainly composed of graphene and formed on the resin layer as a result of removal of the metal thin film layer,
    wherein the transparent conductor has a three-dimensional form including the one transparent conductive portion.

4. A transparent conductor having two transparent conductive portions mainly composed of graphene, and manufactured by using first and second transfer sheets comprising:
    each of first and second substrate sheets having a surface of an arithmetic average roughness (Ra) of 0.1 nm or more and 20 nm or less;
    first and second metal thin film layers formed partially or entirely on the respective substrate sheets to reflect the arithmetic average roughness of the surface of the substrate sheets; and
    first and second transparent conductive film layers formed on the metal thin film layers and mainly composed of graphene, the transparent conductor comprising:
- a first transparent substrate of a three-dimensional form;
- a first resin layer formed on one of surfaces of the first transparent substrate;
- a first transparent conductive portion, as the first transparent conductive film layer, formed of the first transparent conductive film layer mainly composed of graphene and formed on the first resin layer as a result of removal of the first metal thin film layer;
- a second transparent substrate of a three-dimensional form, and a second resin layer formed on one of surfaces of the second transparent substrate; and
- a second transparent conductive portion, as the second transparent conductive film layer, formed of the second transparent conductive film layer mainly composed of graphene and formed on the second resin layer as a result of removal of the second metal thin film layer,
- wherein the first and second transparent electrode portions are opposed to each other to keep electrical isolation, and a three dimensional form including the two transparent conductive portions is employed.

5. The transparent conductor as claimed in claim 2, comprising:
- a pressure conductive layer arranged between first and second transparent electrode portions, and made of an insulative transparent resin and a plurality of electrically conductive pressure-sensitive substances dispersed and contained in the transparent resin,
- wherein when a force acts on one of surfaces of the transparent conductor, the acting force causes an electric current to flow between the pressure-sensitive substances in the pressure conductive layer to achieve conduction between the first and second transparent conductive layers opposed to each other.

6. A manufacturing method of a transparent conductor which includes one transparent electrode portion mainly composed of graphene and has flexibility, comprising:
- a first step of arranging a transfer sheet comprising:
  - a releasable substrate sheet having a surface of an arithmetic average roughness (Ra) of 0.1 nm or more and 20 nm or less;
  - a metal thin film layer formed partially or entirely on the substrate sheet to reflect the arithmetic average roughness of the surface of the substrate sheet; and
  - a transparent conductive film layer formed on the metal thin film layer and mainly composed of graphene, and provided with a transparent conductive portion, as the transparent conductive film layer, within injection molding dies, injecting molding resin, integrally adhering the transfer sheet to one of surfaces of a molded resin article simultaneously with solidification of the molding resin, and removing the releasable substrate sheet thereof; and
- a second step of removing the metal thin film layer formed on the one surface.

7. A manufacturing method of a transparent conductor, comprising:
- a first step of arranging a first transfer sheet comprising:
  - a releasable first substrate sheet having a surface of an arithmetic average roughness (Ra) of 0.1 nm or more and 20 nm or less;
  - a first metal thin film layer formed partially or entirely on the first substrate sheet to reflect the arithmetic average roughness of the surface of the substrate sheet; and
  - a first transparent conductive film layer formed on the first metal thin film layer and mainly composed of graphene, and provided with a first transparent conductive portion, as the first transparent conductive film layer, within injection molding dies, injecting molding resin, integrally adhering the first transfer sheet to a first one surface among molded resin surfaces simultaneously with solidification of the molding resin, and removing the releasable first substrate sheet thereof;
- a second step of removing the first metal thin film layer formed on the first one surface;
- a third step of integrally adhering a second transfer sheet comprising:
  - a releasable second substrate sheet having a surface of an arithmetic average roughness (Ra) of 0.1 nm or more and 20 nm or less;
  - a second metal thin film layer formed partially or entirely on the second substrate sheet to reflect the arithmetic average roughness of the surface of the second substrate sheet; and
  - a second transparent conductive film layer formed on the second metal thin film layer and mainly composed of graphene, and provided with a second transparent conductive portion, as the second transparent conductive film layer, to a second one surface of a flexible transparent substrate having a two-dimensional form by heat and pressure, and removing the second substrate sheet thereof;
- a fourth step of removing the second metal thin film layer formed on the second one surface; and
- a fifth step of adhering the first and second one surfaces together by an adhesive in opposed positions to keep electrical isolation between the first and second transparent conductive portions, and forming a resin layer or a pressure-sensitive conductive layer between the first transparent conductive portion and the second conductive portion,
- wherein the transparent conductor has the two transparent conductive portions characterized by graphene and has a three-dimensional form.

8. A capacitive touch input device comprising:
- a transparent conductor as claimed in claim 1.

9. A transfer sheet comprising:
- a substrate sheet having a surface of an arithmetic average roughness (Ra) of 0.1 nm or more and 20 nm or less;
- a metal thin film layer formed partially or entirely on the substrate sheet to reflect the arithmetic average roughness of the surface of the substrate sheet; and
- a transparent conductive film layer formed on the metal thin film layer and mainly composed of graphene.

10. A transfer sheet as defined in claim 9 further comprising:
- a routing circuit pattern layer formed on a portion of the transparent conductive film layer.

11. A manufacturing method of a transfer sheet, comprising:
- forming a mask layer partially on a substrate sheet having a surface of an arithmetic average roughness (Ra) of 0.1 nm or more and 20 nm or less;
- forming a metal thin film layer on the mask layer and the substrate sheet having the arithmetic average surface (Ra);
- forming the metal thin film layer partially on the substrate sheet by peeling and removing the mask layer and the metal thin film layer formed on the mask layer with a solvent; and
- forming a transparent conductive film layer mainly composed of graphene on the metal thin film layer partially formed on the substrate sheet.

12. A manufacturing method of a transfer sheet, comprising:
- forming a metal thin film layer on a substrate sheet having a surface of an arithmetic average roughness (Ra) of 0.1 nm or more and 20 nm or less;
- forming a resist layer partially on the metal thin film layer to form a portion provided with the resist layer and a portion not provided with the resist layer on the metal thin film layer;
- forming the metal thin film layer and the resist layer partially on the substrate sheet by peeling and removing the metal thin film layer on the portion not provided with the resist layer with a solvent;
- exposing a surface of the metal thin film layer by removing the resist layer with a solvent; and
- forming a transparent conductive film layer mainly composed of graphene on the metal thin film layer having the exposed surface.

\* \* \* \* \*